United States Patent [19]
Liu et al.

[11] Patent Number: 5,326,659
[45] Date of Patent: Jul. 5, 1994

[54] METHOD FOR MAKING MASKS

[75] Inventors: Yong Liu; Avideh Zakhor; Andrew Neureuther, all of Berkeley, Calif.

[73] Assignee: Regents of the University of California, Oakland, Calif.

[21] Appl. No.: 847,757

[22] Filed: Mar. 5, 1992

[51] Int. Cl.⁵ .............................................. G03F 9/00
[52] U.S. Cl. ...................................... 430/5; 430/320; 430/321; 395/800
[58] Field of Search ........................ 430/5, 320, 321; 395/800

[56] References Cited

U.S. PATENT DOCUMENTS 4,593,351  6/1986  Hong et al. ..................... 395/800

OTHER PUBLICATIONS

SPIE vol. 1264 Optical/Laser Microlithography III (1990), article entitled "Optimal Binary Image Design for Optical Lithography," by Yong Liu, et al., pp. 401–412.

Heidelberg Coloquium on Glassy Dynamics and Optimization, Berlin, 1987, entitled "A Pedestrian Review of the Theory and Application of the Simulated Annealing Algorithm," by Emile H. L. Aarts, et al., pp. 288–306.

Proceedings of 24th Conference on Decision and Control, Ft. Lauderdale, Florida, Dec. 1985, entitled "A Tutorial Survey of Theory and Applications of Simulated Annealing," by Bruce Hajek.

Science, May 13, 1983, vol. 220, No. 4598, pp. 339–348, article entitled "Optimization by Simulated Annealing," by S. Kirkpatrick, et al.

Proceedings of 24th Conference on Decision and Control, Ft. Lauderdale, Florida, Dec. 1985, article entitled "Convergence and Finite-Time Behavior of Simulated Annealing," by Debasis Mitra, et al.

Primary Examiner—Marion E. McCamish
Assistant Examiner—Mark A. Chapman
Attorney, Agent, or Firm—Ware and Freidenrich

[57] ABSTRACT

A method for making a mask for optical lithography or other projection printing, wherein the mask is represented by a mask pattern, is disclosed herein. The mask provides a substantially binary output image on the surface of a wafer as light is applied to the mask. Light passes through the mask and onto a wafer at varying intensities, such intensities represented by output intensity values, the threshold values of which produce output images within predetermined constraints. The method includes the steps of defining sampling points which are representative of the binary output image. These sampling points are used in defining local objective functions, which are combined to give a total objective function. The present invention further includes the steps of adjusting the mask pattern to provide for minimization by optimization of the objective function, transferring the mask pattern to a mask generating machine to generate a mask, and generating a mask. Moreover, the present invention includes the step of providing an output image which is focused on a plurality of optical planes. Furthermore, the present invention includes the step isolating three of the plurality of optical planes so that their output intensity is optimized at these planes, thereby producing a focusing plane shift at the center focal plane as well as producing an extended depth of focus.

11 Claims, 21 Drawing Sheets

PHASE CONNECTION

PHASE CONNECTION

PHASE CONNECTION

PHASE CONNECTION

CONVENTIONAL MASK

GOAL OF OPTIMIZATION

METHOD FOR MAKING MASKS

This invention was made with government support under Contract No. F496620-90-C-0029 awarded by the U.S. Air Force. The government has certain rights in this invention.

FIELD OF THE INVENTION

The present invention relates to a method for making mask for optical lithography or other projection printing. More specifically, it relates to a method which utilizes optimization by minimization to make adjustments in a mask pattern.

BACKGROUND OF THE INVENTION

As the minimum feature size of VLSI circuits drops to submicron regions, distortion due to optical diffraction can no longer be neglected. An established practice in microphotolithography to overcome distortions is to introduce deliberate distortions in the mask artwork. The corrections are usually based on experience gained by a process of trial and error. For the recently developed phase-shifting masks, experience is scarce, and intuitions are hard to develop. Therefore, a systematic technique to determine suboptimal, if not optimal, pre-distorted masks can facilitate conventional, chromeless, and phase-shifting mask design.

While phase-shifting masks are used to overcome the diffraction consequences of conventional (binary) masks, and hence provide better resolution than conventional masks, phase-shifting masks contain more information than a conventional transmission mask, and therefore require more complex patterning procedures. For example, a designer of phase-shifting masks should not only take into account the need to compensate for diffraction, but should also provide destructive interference at the wafer's surface for good resolution, therefore making use of the diffraction. Moreover, a designer should also build mask topography which projects a three-dimensional image that adapts to the expected wafer topography. Accordingly, there is a need for a method of designing and, therefore making masks which provides the aforedescribed characteristics.

OBJECTS AND SUMMARY OF THE INVENTION

It is therefore a general object of the present invention to provide a method for making mask for optical lithography or other projection printing.

It is another object of the present invention to provide a method for making masks providing contractive and destructive interference at the wafer's surface so that the output image has good resolution.

It is a further object to provide mask pattern which projects a three-dimensional image that adapts to the expected wafer topography.

It is also an object of the present invention to provide a fast, computer aided design tool for designing and making both conventional and phase-shifting masks.

The foregoing and other objects of the invention are achieved by method for making masks which compensates for optical diffraction, provides for an extended depth of focus and allows a shift of the focus plane. These features are made possible by defining the mask elements in terms which are amendable to formulation as a combinatorial optimization problem.

A mask which is represented by a mask pattern, provides a substantially binary output intensity image on the surface of a wafer as light passes through the mask. As light passes through the mask and onto a wafer at varying intensities, the intensities are represented by output intensity values.

The method of the present invention begins with a first or initial mask pattern and then reconfigures the pattern so that its output at the wafer is the desired pattern. At the end of the method, the threshold values of the output intensity values are mostly within predetermined constraints.

The method includes the steps of defining sampling points which are representative of the binary output image. These sampling points are used in defining local objective functions, which are combined to give a total objective function. The present invention further includes the steps of adjusting the mask pattern to provide for minimization by optimization of the objective function, transferring the mask pattern to a mask generating machine to generate a mask, and generating a mask. Moreover, the present invention includes the step of providing an output image which is optimized on a plurality of optical planes. Furthermore, the present invention includes the step of isolating a number, such as three, of the plurality of focal planes so that their output intensity is maximized, thereby producing a focusing plane shift at the center optical plane.

BRIEF DESCRIPTION OF THE DRAWINGS

Other objects, and many of the intended advantages of the present invention, will be readily appreciated as the same becomes better understood by reference to the following detailed description when considered in connection with the accompanying drawings wherein.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to those emobidments. On the contrary, the invention is intended to cover alternatives, modifications and equivalents, which may be included within the spirit and scope of the invention as defined by the claims.

Figure 1:
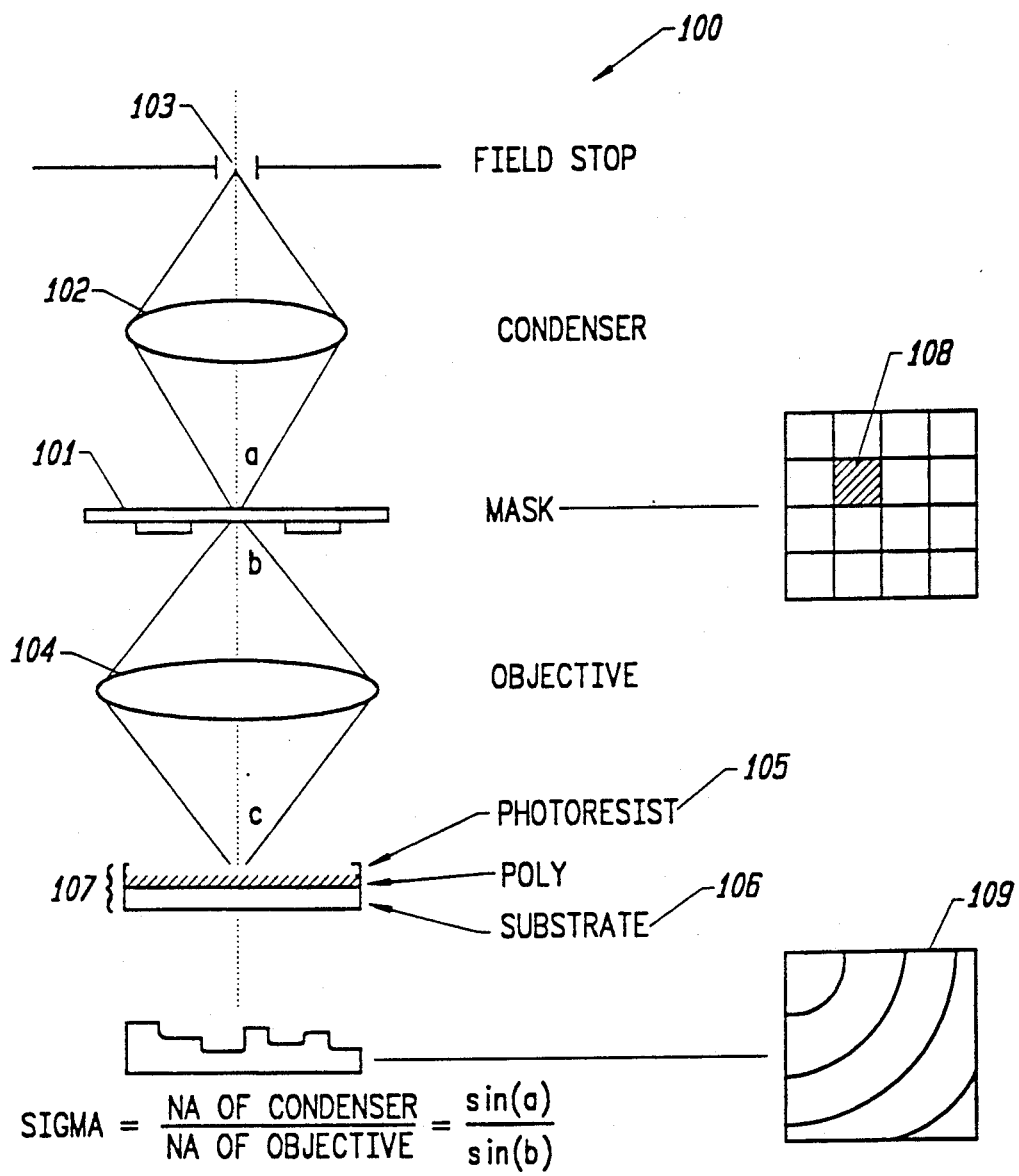
FIG. 1 is a schematic diagram of the photolithography optical system.

Attention is drawn to FIG. 1 which is a schematic diagram of the photolithography optical system 100. The mask 101 is positioned so that light which passes through condenser 102 from the field stop 103 is directed through mask 101. The mask pattern is projected through an objective lens 104 on to a photoresist layer 105 on wafer 107. The mask 101 of the present invention, is a two dimensional pixel array. The pixels 108 can be any shape including square or rectangular.

In the case of a conventional (binary) mask, the pixels 108 are either completely blocked or open. In the case of phase-shifting masks, neighboring apertures have opposite phases so that the fringing fields at the image can overlap and interfere constructively or destructive. In either case, the exposure and subsequent development of the layer of resist 105 defines the mask pattern on the wafer 107, that is on the resist 105 atop the substrate 106. A contour plot 109 can be generated depicting the output intensity distribution of the mask 101 patterned on the wafer 107.

The present invention includes configuring the mask 101 into a two-dimensional array of binary pixels or multi-level pixels and establishing criterion for evaluation of the output intensity at sample points on the wafer's surface. The criterion is best satisfied by utilizing a combinatorial mathematical optimization technique.

It should be noted that the present invention can also be used to compensate for the aberrations of photoresist exposing equipment similar to that shown in FIG. 1. By modeling the equipment, and generating an intensity computation (described below) of light reaching the wafer, the present method can be used to compensate for the aberrations of the equipment.

Figure 2:
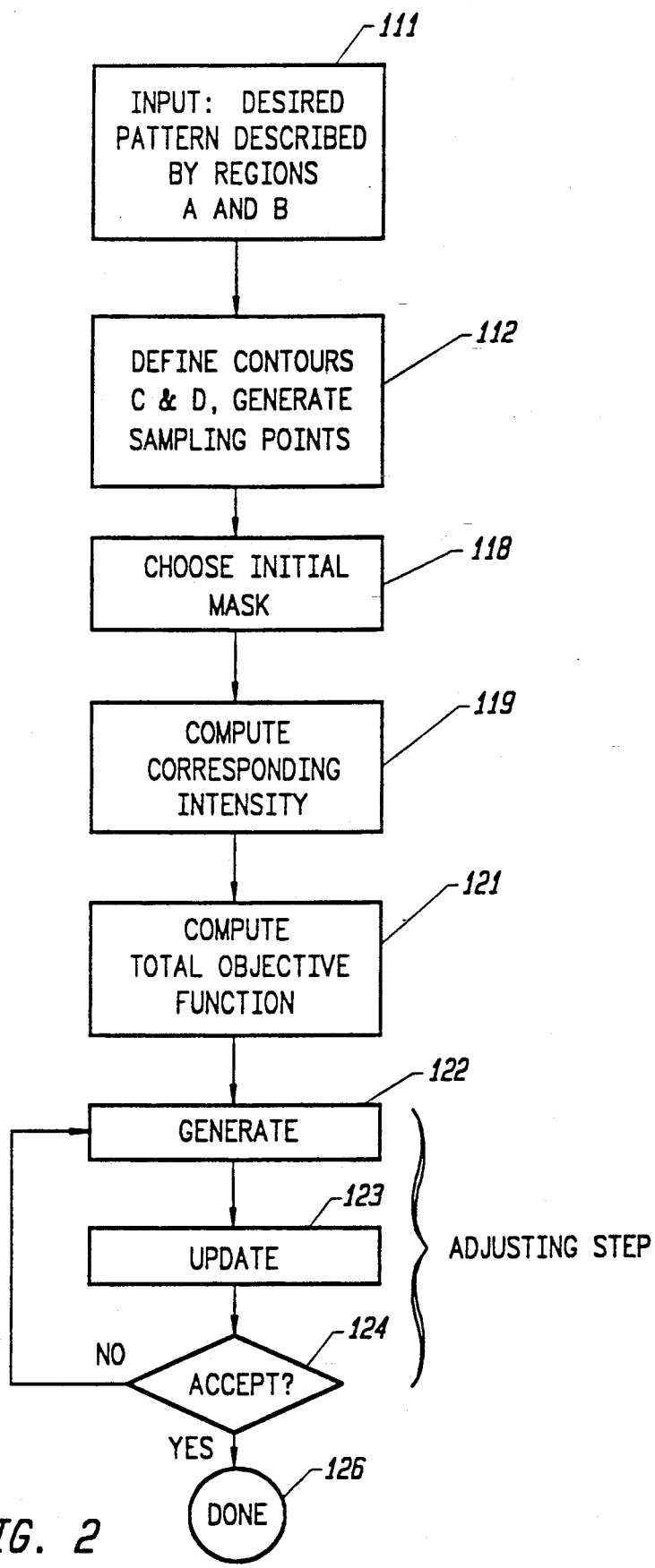
FIG. 2 is a flow chart of the preferred method of the present invention.

Turning to FIG. 2, the first step numbered 111 of the present invention is inputting a desired binary aerial image on the wafer 107. The first pattern generated is ultimately the pattern which is desired to be on the wafer after exposure. For example, a mask pattern could include corners, elbow and cross connections. When light is applied to the mask, light passes therethrough onto the wafer, generating an output image on the wafer. The intensity of the light at the wafer is defined as output intensity, $I(\vec{x})$, where $\vec{x}$ represents the spatial location (x,y) of I on the wafer.

Also included in the first step 111 as shown in FIG. 2, the binary mask pattern is defined as regions A and B, such that the pattern is zero in domain A and one in domain B. The next step 112, further defines contours C and D which surround A and B, respectively, and where contour C is in region A and contour D is in region B. Accordingly, the following constraints have been chosen:

$$\begin{aligned}I(\vec{x}) &\leq a \quad \vec{x} \epsilon A \\ I(\vec{x}) &\geq b \quad \vec{x} \epsilon B \\ I(\vec{x}) &\leq c \quad \vec{x} \epsilon C \\ I(\vec{x}) &\geq d \quad \vec{x} \epsilon D,\end{aligned} \qquad \text{Eq. 1}$$

where a, c and d are the corresponding intensity threshold values in regions A, B, C and D.

Figure 3:
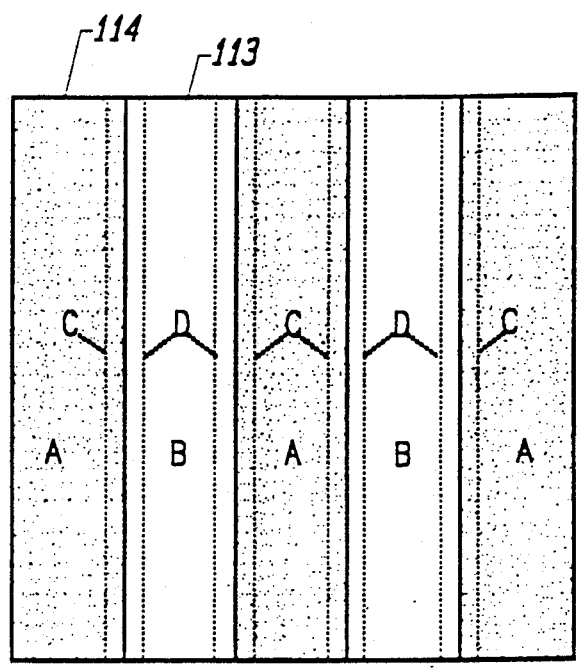
FIG. 3 is a schematic diagram of a desired binary image of two infinitely long bars.

Turning to FIG. 3, which is a schematic diagram of a desired binary image of two infinitely long bars, the desired image is one in region B, numbered 113 and zero in region A, numbered 114. Regions between contours C and D are transition regions. In a simplified embodiment of the present invention, the regions A and B are essential, and contours C and D, do not necessarily need to be included.

Figure 4:
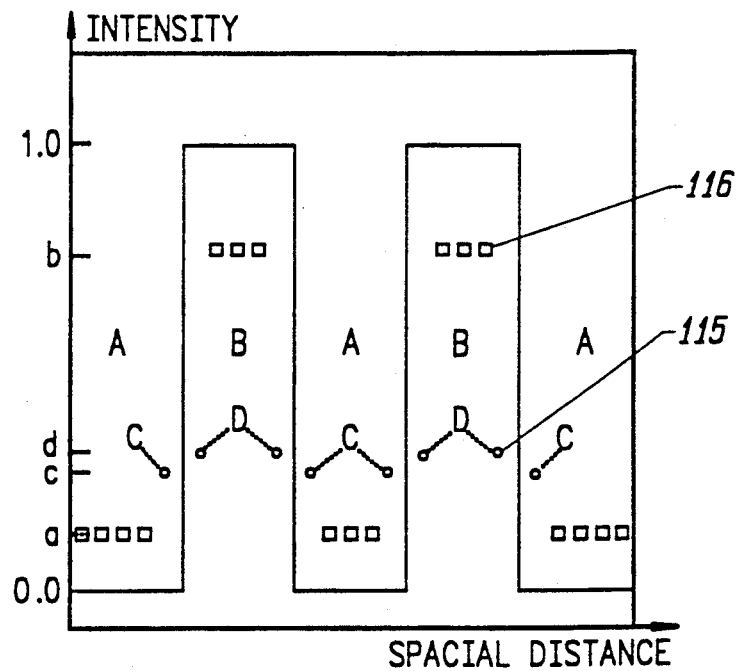
FIG. 4 is a cross sectional diagram of FIG. 3 illustrating the sampling points for enforcing specification constraints of the present invention.

Step numbered 112 includes generating sampling points. Turning to FIG. 4, shows circular 115 and square dots 116 depicting the sampling points. The sampling points are used for enforcing the constraints of inequities of Eq. 1. As long as the samples are dense enough, satisfying the constraints at the sampling points results in satisfying the constraints in an entire region. This is because the image intensity is a band-limited function. The circular dots 115 are used to control line width.

Figure 5:
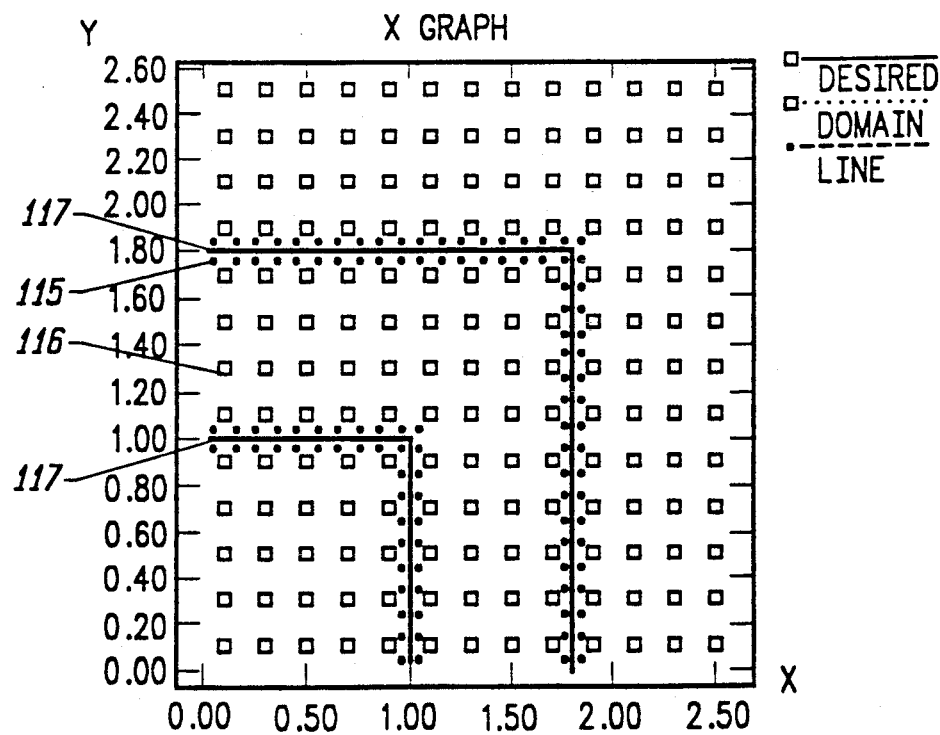
FIG. 5 is schematic diagram showing sampling point distribution for an elbow on a mask.

FIG. 5 is a schematic diagram showing sampling point distribution for an elbow on a mask. The dark lines 117 are the desired contours. The regions outside (between) the two dark lines 117 are regions A and the sampling points 115, which are white circles and the sampling points 116 which are white squares. The lines formed by the circular sampling points 115 inside region (B) correspond to contour C (D). To increase flexibility, different densities for contour samples and region samples may be chosen.

Figure 6:
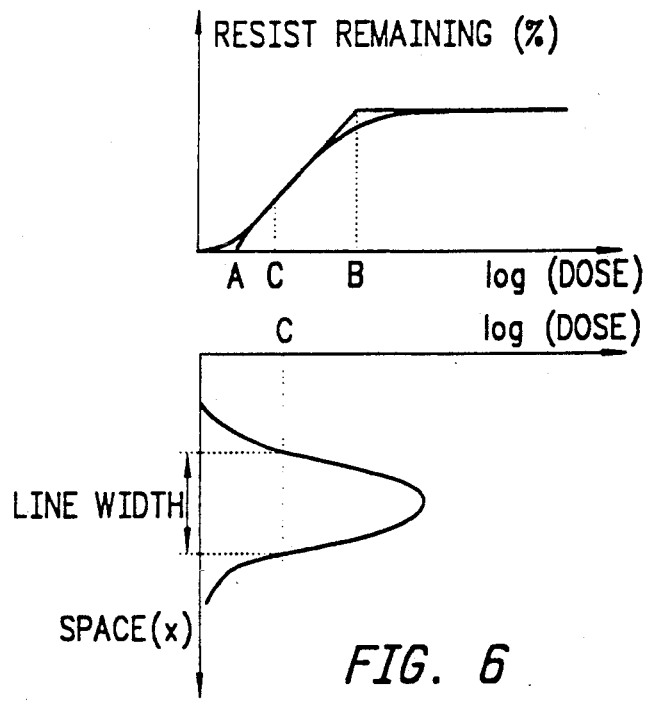
FIG. 6 is two graphs illustrating a simple model of photoresist.

Taking into account the process of photoresist development and assuming that the normalized 0.3 intensity contours correspond to the line edges after development, the intensity threshold values a, b, c and d can be used to represent a simple photoresist model, as shown in FIG. 6, where $d=c=0.3$. As a rule of thumb, the line width corresponds to the 0.3 contour of light intensity when the light is normalized by that of a large feature.

Once the sampling points have been generated, the initial mask has therefore been generated at step numbered 118. The next step is the output intensity image computational step numbered 119 for each sampling point. The present invention provides the method of finding a set of pixel configurations such that the output intensity I(x,y) satisfies all of the constraints of Eq. 1 as much as possible which describe the desired output image at an appropriate set of sampling points.

Figure 7:
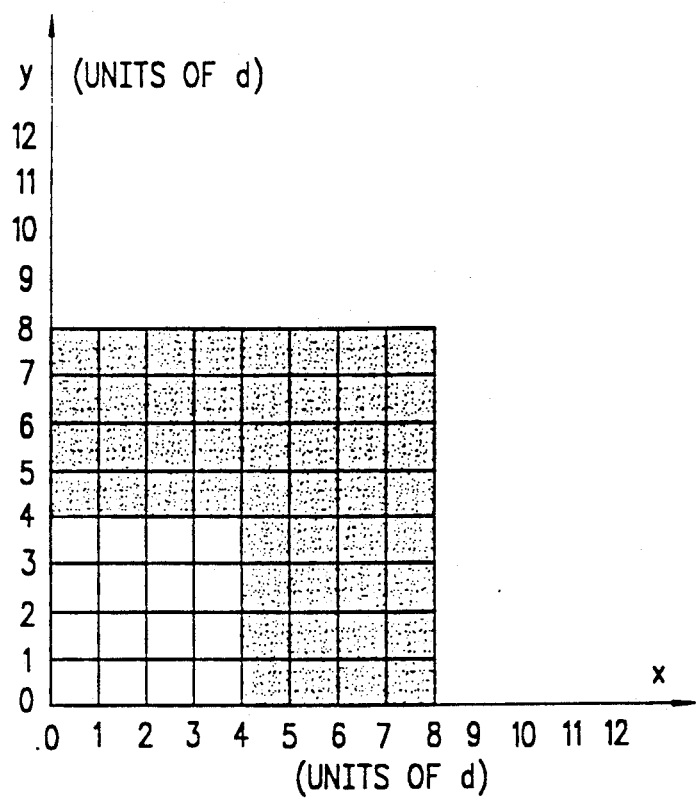
FIG. 7 shows a regular mask for a corner.
Figure 8:
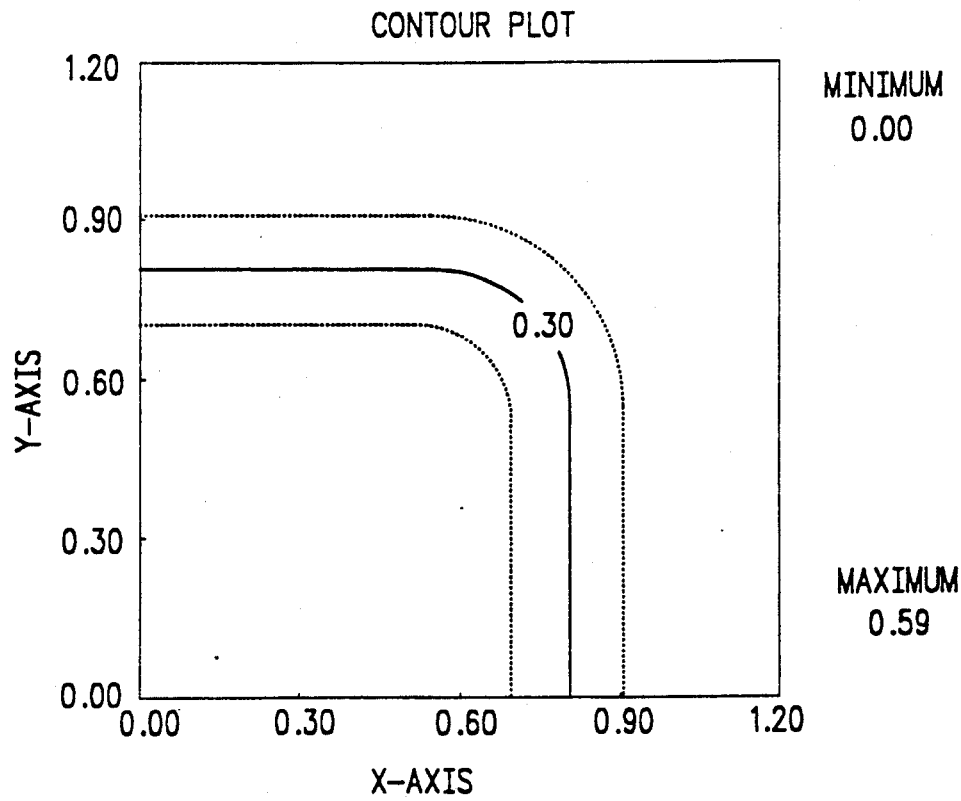
FIG. 8 is a contour plot showing the output intensity distribution of the regular mask of FIG. 7 under incoherent illumination.

FIG. 7 shows a regular mask for a corner and FIG. 8 shows a contour plot of the output intensity distribution due to mask of FIG. 7 under incoherent illumination which extends to the eighth unit. In order calculate the output intensity distribution, computer simulations are made. The calculations and images of FIG. 12, 14, 16, 18 which are under partially coherent illumination, were performed by the lithography imaging program SPLAT and the photoresist program SAMPLE3D. Other suitable means for calculating the output intensity are within the scope of the present invention.

By computing the intensity at each sampling point, a local objective function $h_i(I(\vec{x}_k,\vec{a}))$ (also called a local cost function) can be defined in step numbered 121. The local objective functions include error functions $e_i$, representative of the degree to which the output intensity values of the sampling points are within the constraints of Eq. 1. Moreover, the local objective functions include penalties $\lambda_i$ which are reflective of the relative importance of each of the regions and contours. A local objective function is defined as follows:

$$h_i(I(\vec{x}_k,\vec{a})) = \begin{cases} e_k(I(\vec{x}_k,\vec{a})) & \text{if } e_k(I(\vec{x}_k,\vec{a})) < 0 \\ \lambda_i e_k(I(\vec{x}_k,\vec{a})) & \text{if } e_k(I(\vec{x}_k,\vec{a})) > 0 \end{cases} \quad \text{Eq. 2}$$

The error functions are defined as follows:

$$e_k(I(\vec{x}_k,\vec{a})) = \begin{cases} I(\vec{x}_k,\vec{a}) - a & \text{if } \vec{x}_k \in A \\ b - I(\vec{x}_k,\vec{a}) & \text{if } \vec{x}_k \in B \\ I(\vec{x}_k,\vec{a}) - c & \text{if } \vec{x}_k \in C \\ d - I(\vec{x}_k,\vec{a}) & \text{if } \vec{x}_k \in D \end{cases} \quad \text{Eq. 3}$$

The error function $e_k(I(\vec{x}_k,\vec{a}))$ in Eq. 3 is chosen in accordance with the inequalities of Eq. 1. Specifically since $I(\vec{x}_k)$ is specified to be smaller than a and c in inequalities of Eq. 1 respectively, the form of $e_k(I(\vec{x}_k,\vec{a}))$ for $\vec{x}_k \in A$ and $\vec{x}_k \in C$ in Eq. 3 is chosen in such a way so that when the objective function is minimized, $e_k$ is forced to be as negative as possible. A similar argument can be made for $\vec{x}_k \in B$ and $\vec{x}_k \in D$. Therefore the more positive (negative) the error function is, the more (less) it violates the constraints in inequalities of Eq. 1.

The error functions of the present invention are chosen to be nonlinear functions. Therefore, it is possible to measure the quality of an image as compared to the desired image with a scaler, which in turn makes it possible to formulate the design problem as an optimization problem in combinatorial mathematics.

The total objective function (also called the total cost function) is then chosen to be a sum of local objective functions corresponding to different sampling points and is given by $$H(\vec{a}) = \sum_{k \in N_A} h_A(I(\vec{x}_k,\vec{a})) + \sum_{k \in N_B} h_B(I(\vec{x}_k,\vec{a})) + \sum_{k \in N_C} h_C(I(\vec{x}_k,\vec{a})) + \sum_{k \in N_D} h_D(I(\vec{x}_k,\vec{a})) \quad \text{Eq. 4}$$

where k is the index for sampling points $\vec{a}$ is the vector of pixel variables, $N_i$ is the set of indices of the samples in region i with i=A, B, C or D.

The penalty values, as noted above in FIG. 2, are reflective of the importance of each of the regions and contours. They are chosen such that whenever the constraints of Eq. 1 are violated at any sampling point by a certain small amount, the increase in the objective function due to that point will be larger than the sum of all the negative contributions from those sampling points at which the constraints in inequalities of Eq. 1 are satisfied, i.e., $e_k<0$. Therefore the objective function is dominated by the constraint violating points. This way, the elimination of constraint violating points becomes the highest priority of the optimization process. Only when all the constraints are satisfied, does the optimization scheme start paying attention to the improvement of constraint satisfaction. To achieve the above goal, the penalty factors are chosen as follows:

$$\lambda_i = \lambda'_i K \quad \text{Eq. 5}$$

where $\lambda'_i$ is the penalty factor which reflects the relative importance of each region or contour, and K is a large positive constant.

The goal of the adjusting step of the present invention is to minimize the value of the total objective function of Eq. 4. Because the total objective function is a quantitative measure of the "goodness" of the complex system, the adjusting step of the present invention adjusts the total objective function, pixel by pixel, until the mask reaches a configuration in which the constraints of Eq. 4 are satisfied as best as possible.

In the preferred embodiment, a simulated annealing algorithm is used in the adjusting step to provide for minimization by optimization of the total objective function. Simulated annealing is preferred because its ability to handle objective functions of many independent variables, its ability to handle arbitrarily created nonlinear objective function and its ability to handle partially coherent illumination functional relationships. However, depending upon the intended use of the present invention, other combinatorial mathematical algorithms can be used. For example, for making binary masks, the use of a branch and bound algorithm in the adjusting step of the present invention is satisfactory.

In the simulated annealing structure, three functions play a fundamental role: accept, generate and update. The algorithm interrogates the total objective function to determine if it has been minimized, that is, whether the constraints of Eq. 1 have been satisfied as best as possible. If not, it generates a new configuration. The algorithm then updates the new configuration by what is called the annealing or cooling schedule.

There are many scholarly papers written on the theories of simulated annealing. The following are useful references for an understanding of simulated annealing: B. Hajek, "A tutorial survey of theory and applications of simulated annealing" In Proc. 24th Conf. On Decision and Control, pages 775-760, Ft. Lauderdale, December 1985; S. Kirkpatrick, C.D. Gelatt Jr., and M.P. Vecchi, "Optimization by simulated annealing", Science, 20:671-680, 1983; and D. Mitra, F. Romeo, and A. Sangiovanni-Vincentelli, "Convergence and finite-time behavior of simulated annealing" In Proc. 24th Conf. On Decision and Control, pages 761-767, Ft. Lauderdale, December 1985.

Briefly, simulated annealing is a technique developed in recent years to solve complex optimization problems. It is based on the analogy between the simulation of the annealing of solids and the problem of solving large combinatorial optimization problems.

In combinatorial optimization problems, if it is assumed that states of a solid and therefore the objective function H correspond to energy, and the control parameter T to temperature in physics, then the annealing process can be simulated on a computer by assigning the Boltzmann distribution to the configurations according to the total objective function of Eq. 4. The annealing process in physics for finding the ground state of a solid is then equivalent to finding the set of configurations which result in minimum value of objective function in combinatorial optimization.

Consider different binary patterns of the mask, denoted by a random vector X, to be the state of a statistical system. If the objective function, or energy function corresponding to a state X is H(X), then according to Boltzmann distribution the probability of being in state X at thermal equilibrium is $$P\{X = X\} = \frac{1}{Z(T)} e^{-\frac{H(X)}{T}} \quad \text{Eq. 6}$$

where Z is a normalizing constant, or the partition function in statistical physics. At high temperature, this distribution is almost uniform, and the system is equally likely to be in any state. Gradually the temperature parameter T is decreased, allowing the system to reach thermal equilibrium at each T. As the temperature decreases, the Boltzmann distribution concentrates more on the states with the lowest energy. Finally, when the temperature approaches zero, all other states except for the minimum energy states have a zero probability of occurrence, and a ground state is found. However, if the temperature is decreased too fast, the system may get trapped in some local minimum of energy, as in the case of annealing solids, where defects occur.

In computer simulations, a sequence of decreasing temperatures, $\{T_m\}$, with $T_m \rightarrow 0$ is carefully chosen. Starting from an initial mask pattern, at each $T_m$ a sequence of mask patterns or states is generated by randomly choosing a pixel and flipping it to the other state. Referring to FIG. 2, this is the generating step numbered 122 (also called a proposal for transition). If we denote the state before the flip to be state i, the state after the flip to be state j, and the resulting change of energy by $\Delta H_{ij} = H(X_j) - (X_j)$, then the probability for state j to be the next state in the sequence is chosen to be 1, if $\Delta H_{ij} < 0$, and $$\exp\left(-\frac{\Delta H_{ij}}{T_m}\right)$$

if $\Delta H_{ij} \geq 0$. Thus there is a non-zero probability of continuing with a mask pattern with higher energy than the current state. This process is continued until equilibrium is reached, i.e., until the probability distribution of the system approaches the Boltzmann distribution, given by Eq. 6. The probability of making a transition from state i to state j does not depend on the history of how state i was reached, hence the generated sequence $(X_m(n))$ for each $T_m$ is a Markov chain, [13].

In the step numbered 123 shown in FIG. 2, called the updating step, the temperature is then lowered in steps, with the system being allowed to approach equilibrium for each step of $T_m$ by generating a sequence of mask patterns in the previously described way. The algorithm is terminated for a small value of $T_m$, for which virtually no deterioration is accepted anymore. Step numbered 124 asks whether this configuration should be accepted.

Each time a mask pattern is randomly generated in step numbered 122, the corresponding intensities are computed and total objective function $H_1(\bar{a})$ is generated. $H(\bar{a})$ is then compared to $H_1(\bar{a})$ to decide whether to accept the mask generated at step numbered 122. If the answer is NO, the generated step numbered 122 is revisited. If the answer is YES, the final "frozen" state, or mask pattern, is then taken as the solution to the mask optimization problem as indicated in step numbered 126.

For phase-shifting masks with two phases, (0°, 180°) the values of each pixel variable can take are $\{-1,0,1\}$. A pixel is still randomly chosen, however, there are two proposed transitions instead of one for each pixel. An acceptance step numbered 124 that decides which of the three states may be the next state in the sequence has to be chosen. The proposed transition is considered rejected if the pixel value is not changed according to the acceptance rule. The proposed transition is considered accepted if proposed pixel variable takes one of the other two values different from its original value, according to the acceptance rule.

The acceptance rule can be chosen to be the conditional probability of state j, given the previous state i and the pixel k chosen to be perturbed. According to Boltzmann distribution, this conditional probability is, $$A_{ij}(T) = \frac{\exp(-H(\vec{a}_j)/T)}{\sum_{l \in \omega} \exp(-H(\vec{a}_l)/T)} \qquad \text{Eq. 7}$$
$$= \frac{\exp(-\Delta H_{ij}/T)}{\sum_{l \in \omega} \exp(-\Delta H_{il}/T)}$$

where l is the index for possible next states, $\omega$ is the set of three states generated by keeping all other pixel values the same as in state i except for pixel k, which takes on values $\{-1,0,1\}$, and $\Delta H_{il}$ is the change of cost function from state i to state 1. While Eq. 7 can be used for a phase-shifting mask for two phases, other acceptance rule equations can be configured to include conditional probabilities for additional phases.

Since the light intensity due to a pixel dies out with distance, and the interaction between two pixel light sources decreases with their distance, the light intensity and hence the objective function at any sampling point is a function of only its neighboring pixels, say in a circular region centered at the sampling point with radius R. For the same reason, any pixel can influence the intensity only at sampling points in a circular region centered at the pixel with radius R. The acceptance probability of a change of value of pixel k depends on the change of objective function $\Delta H_{il}$, which only depends on the light intensity at sampling points in a neighborhood of pixel k. The intensity at those sampling points in turn only depends on values of pixels in their neighborhood. Therefore, the acceptance at those sampling points in turn only depends on values of pixels in their neighborhood. Therefore, the acceptance probability only depends on the values of pixels in a region centered at pixel k with radius 2R.

The choice of the temperature sequence $\{T_m\}$ and the length of Markov chains is called a cooling schedule. The cooling schedule has a great deal of influence on the performance of the simulated annealing algorithm. Before describing the cooling schedule of the present invention, the concept of quasi-equilibrium is introduced: let $L_m$ be the length of the $m^{th}$ Markov chain, $\bar{b}(L_m, T_m)$ and $\bar{q}(T_m)$ be the vectors representing the probability distribution after $L_m$ transitions and the stationary distribution of the homogeneous Markov chain at the value $T_m$ respectively. An annealing algorithm is said to be in quasi-equilibrium at the value of control parameter $T_m$, if $\| \bar{b}(L_m, T_m) - \bar{q}(T_m) \| < \epsilon$ for the required precision $\epsilon$. The definition of the metric $\| \cdot \|$ affects the cooling schedules. The following discussion describes the particular cooling schedule chosen for use in the preferred embodiment:

Initial value of control parameter. The initial value of the control parameter T is chosen such that all transitions are equally likely to be accepted, ignoring the differences in objective function. As a quantitative measure, the acceptance ratio is defined as $\chi$ as the number of accepted transitions divided by the number of proposed transitions. The initial value is chosen $\chi_0$, and $T_0$ is determined by calculating the average increase in cost function over all proposed transitions, $\overline{\Delta H+}$, for a number of random transitions and set $T_0$ to be:

$$T_0 = \frac{\overline{\Delta H+}}{\ln[1/\chi_0]} \qquad \text{Eq. 8}$$

Final value of the control parameter. The final value is the stopping criteria for the entire simulated annealing algorithm. A reasonable choice would be to terminate the execution of the algorithm if the last states of consecutive Markov chains are identical for a number of chains.

Length of Markov chains. An intuitive choice of the length of the Markov chains which is based on the concept of quasi-equilibrium was made by Skiscim and Golden: define an epoch as a number of transitions with a fixed number of acceptances and the cost of an epoch as the cost value of the last state of an epoch. As soon as the cost of an epoch is within a specified distance from the cost of one of the preceding epochs, the Markov chain is terminated. This way, the termination of a Markov chain is related to the fluctuations of the values of the cost function in that chain.

Decrement of the control parameter. There is a trade-off between the speed of reducing the control parameter $T_m$ and the length of $L_m$ of the Markov chain at that particular $T_m$. The convergence of simulated annealing algorithm is based on consecutive transitions from one equilibrium to another equilibrium. In computer simulations, the concept of quasi-equilibrium has to be used. A Markov chain is terminated when quasi-equilibrium is achieved at the value of control parameter $T_m$. When $T_m$ is decreased to $T_{m+1}$, the quasi-equilibrium is disturbed. A new sequence of Markov chain is constructed to achieve a new quasi-equilibrium. For larger decreases in $T_m$, the previous quasi-equilibrium is disturbed more seriously, and the length $L_{m+1}$ of the Markov chain has to be longer in order to re-establish quasi-equilibrium. For this reason, one usually opts to decrement $T_m$ slowly. A number of authors have used geometric sequence for $T_m$, $$T_m = \alpha T_{m-1}, = m = 0, 1, 2, \ldots, \qquad \text{Eq. 9}$$

where $\alpha$ is a constant smaller than but close to 1. Choices have ranged from 0.5 to 0.99 by different authors. In the simulations described herein, $\alpha = 0.9$ has been chosen.

It should be noted that the iterative algorithm, in which a transition is accepted (rejected) if results in a reduction (increase) of objective function, is simply a greedy annealing algorithm in which the temperature is reduced to zero at the very beginning of the annealing process. While the iterative algorithm is less computation intensive than the simulated annealing algorithm, it results in local rather than global minimum. Therefore it could potentially result in acceptable mask designs if the initial patterns are chosen close to a global minimum.

Figure 10:
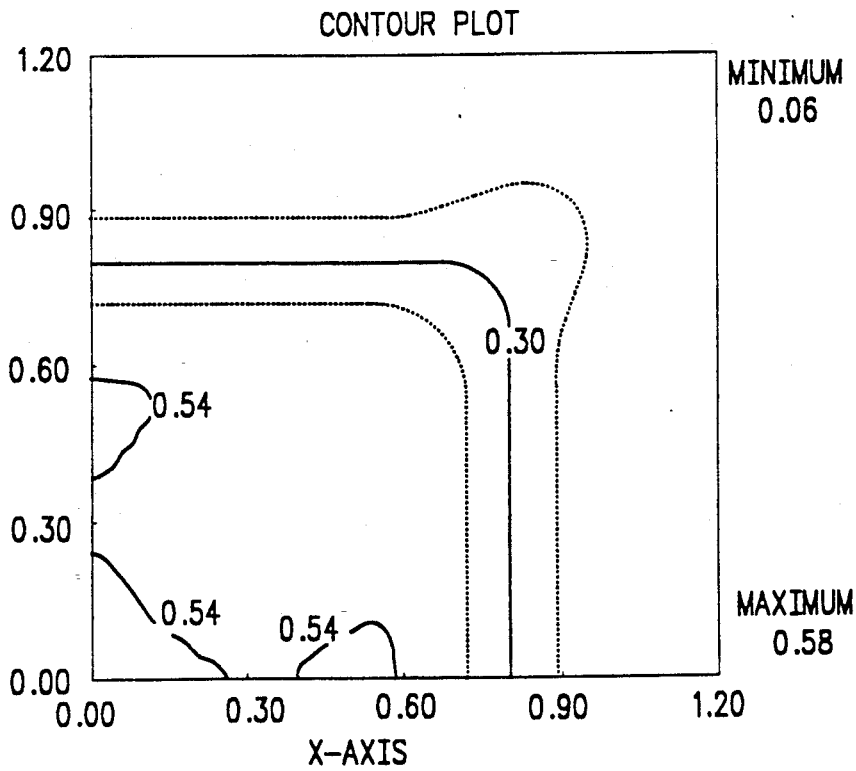
FIG. 10 is a contour plot showing the output intensity distribution of the mask of FIG. 9 under incoherent illumination.
Figure 11:
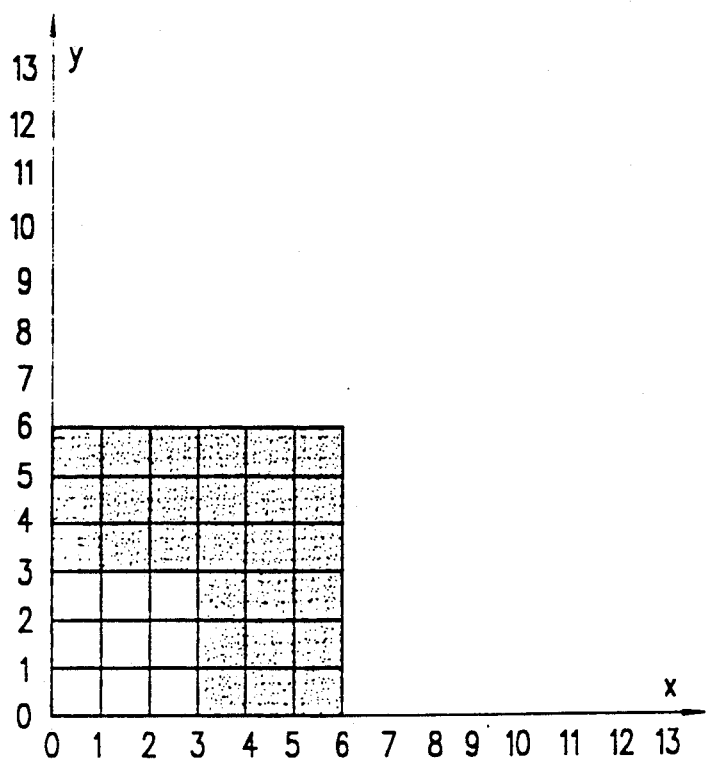
FIG. 11 shows a regular mask for a corner.
Figure 12:
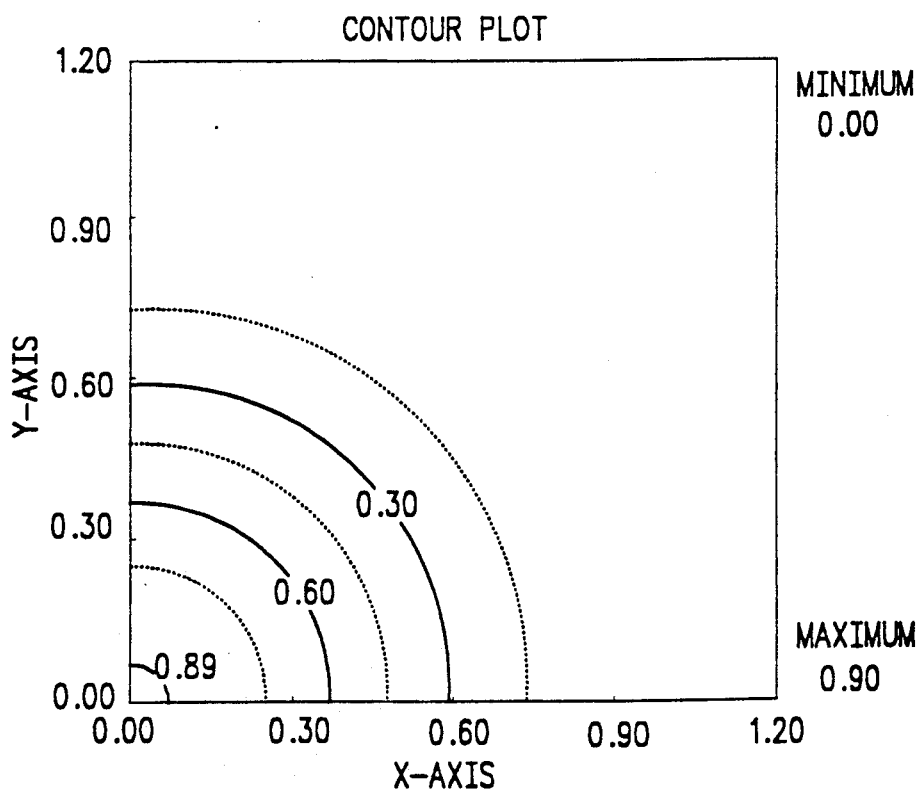
FIG. 12 is a contour plot showing the output intensity distribution of the regular mask of FIG. 11 under partial coherent illumination.
Figure 18:
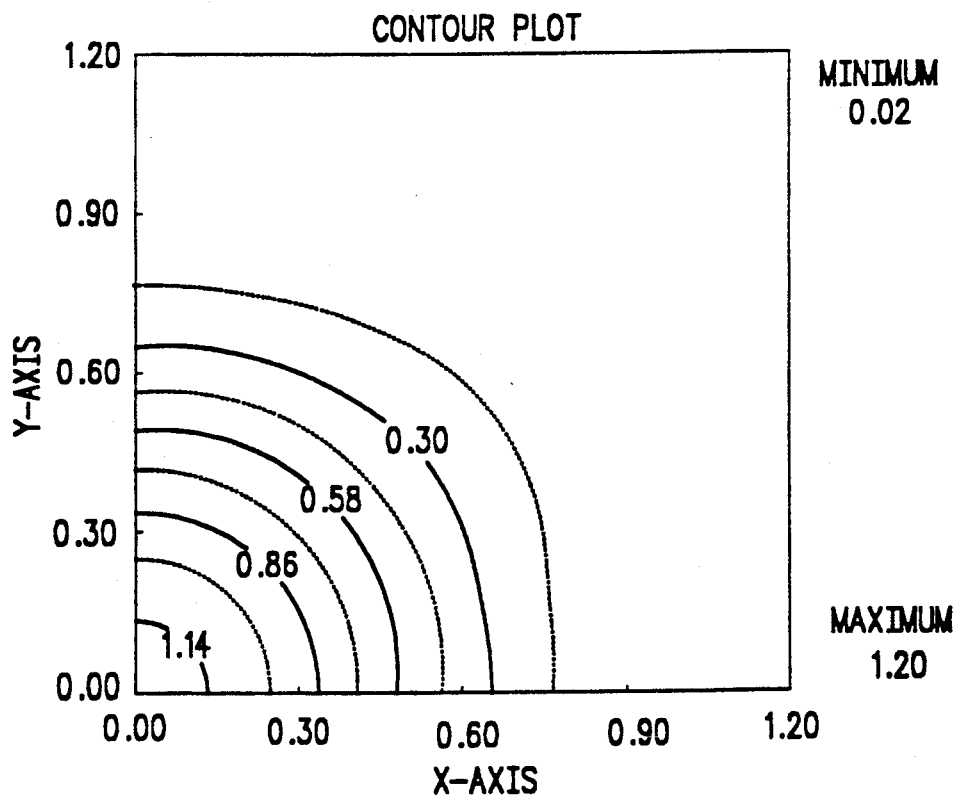
FIG. 18 is a contour plot showing the output intensity distribution of the designed phase-shifting mask of FIG. 17 under partial coherent illumination.
Figure 19:
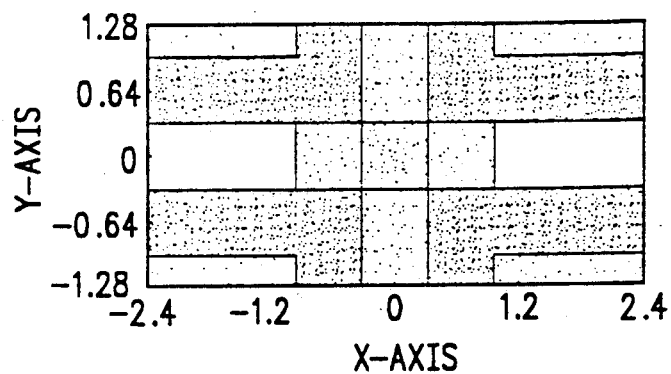
FIG. 19 shows a simple 0°/180° phase connection mask with a 90° phase.
Figure 20:
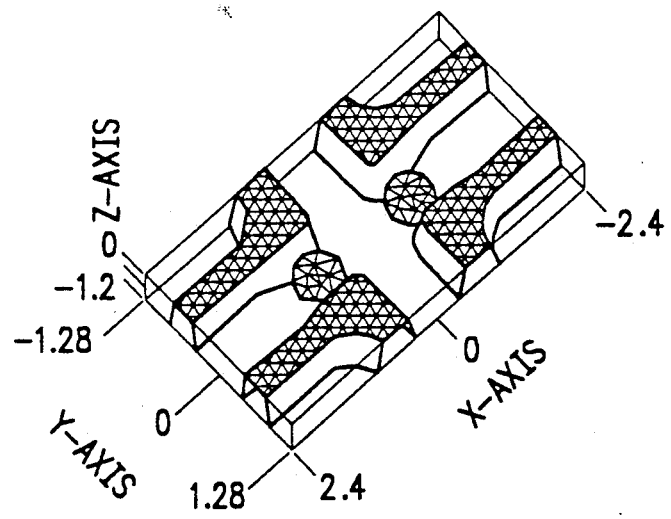
FIG. 20 shows a simulated developed resist profile from the simple mask of FIG. 19.

In the adjusting step of the present invention depicted in FIG. 2 as steps 122-124, generating, updating and accepting, respectively, the change of intensity due to one pixel change is calculated only in a neighborhood of that pixel; after every 20 accepted transitions, the whole intensity profile is re-calculated. In the mask patterns shown in FIGS. 7-18, which are examples of corners, elbows, and phase connections, the dark regions represent opaque areas, the light shaded regions represent 180° phase shift area without damping, and the white regions represent transparent area. FIGS. 7, 11 and 19 represent conventional (binary) masks having no pre-distortion characteristics. FIGS. 8, 12 and 20 represent the contour plots of the image output intensity distribution of FIGS. 7, 11 and 19 at the wafer's surface respectively.

Figure 9:
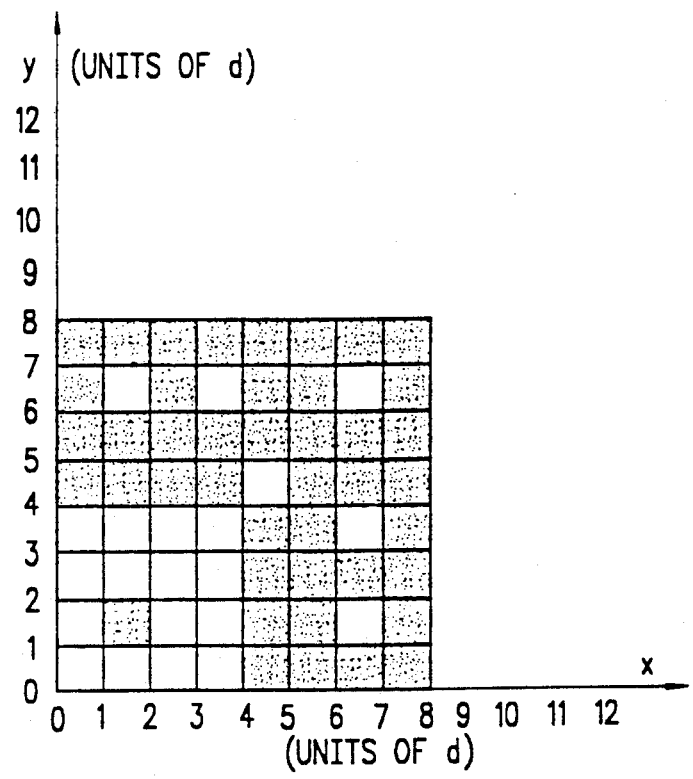
FIG. 9 is a designed mask for a corner using the a branch and bound algorithm in the adjusting step of the present invention.

FIG. 9 shows a conventional (binary) mask designed using a branch and bound algorithm in the adjusting step of the present invention. FIG. 10 is the contour plot of the output intensity distribution of the mask of FIG. 9 under incoherent illumination. By comparing FIG. 8 with FIG. 10, it can be observed that the contour plot of FIG. 10 is sharper and more defined than the contour plot of FIG. 8, even though both were under incoherent illumination.

Figure 13:
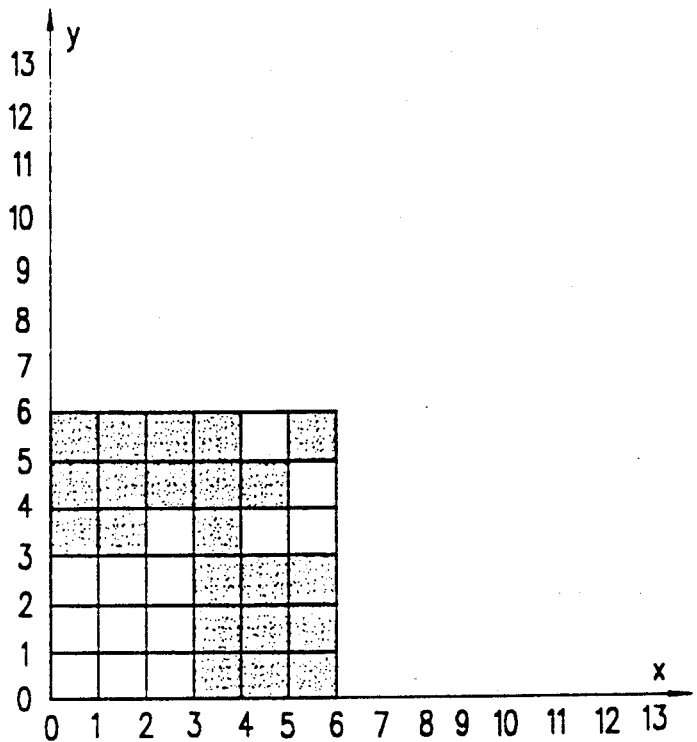
FIG. 13 is a designed binary mask for an elbow using a simulated annealing algorithm in the adjusting step of the present invention.
Figure 14:
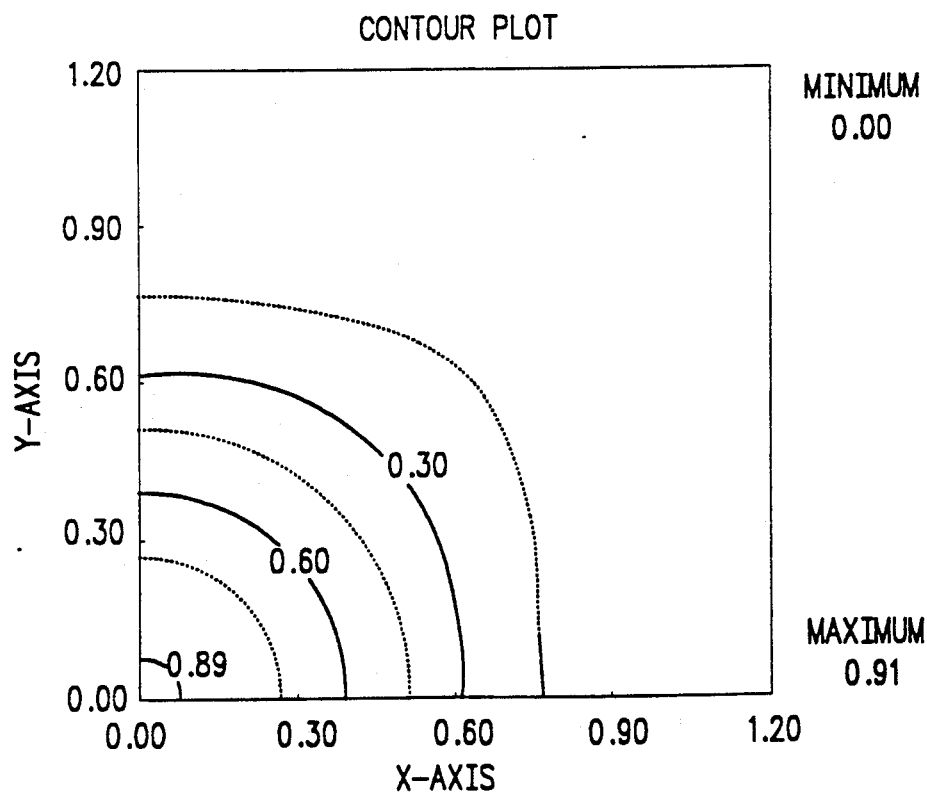
FIG. 14 is a contour plot showing the output intensity distribution of the binary mask of FIG. 13 under partial coherent illumination.

FIG. 11 shows a conventional (binary) mask and FIG. 12 is a contour plot of the output intensity distribution of the mask of FIG. 11 under partial coherent illumination. FIG. 13 shows a conventional (binary) mask for the corner of FIG. 11 designed using a simulated annealing algorithm in the adjusting step of the present invention. FIG. 14 is the contour plot of the output intensity distribution of the mask of FIG. 13 under partially coherent illumination. By comparing FIG. 12 with FIG. 14, it can be observed that the contour plot of FIG. 14 is sharper and more defined than the contour plot of FIG. 12.

Figure 15:
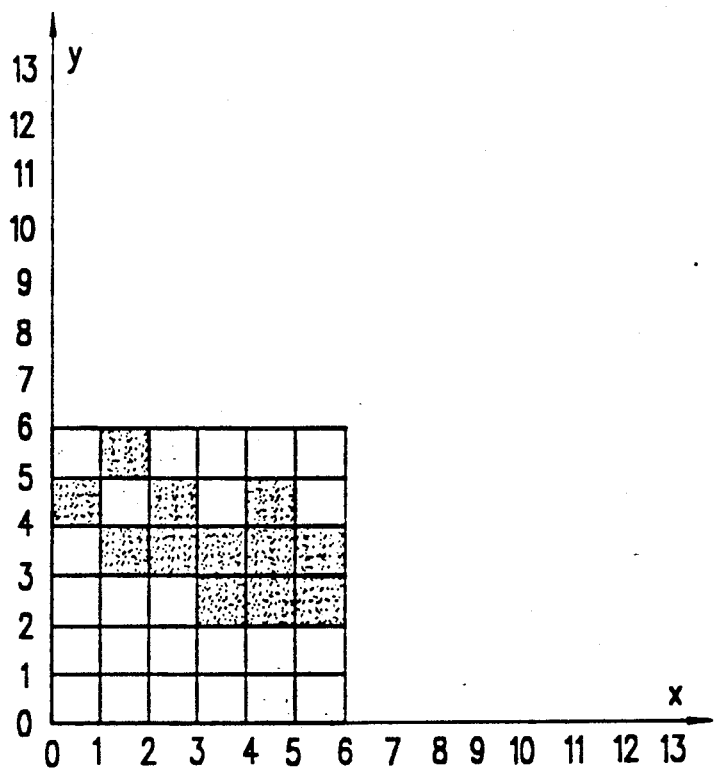
FIG. 15 is a designed phase-shifting mask for the corner of FIG. 11 by an iterative method of the prior art.
Figure 16:
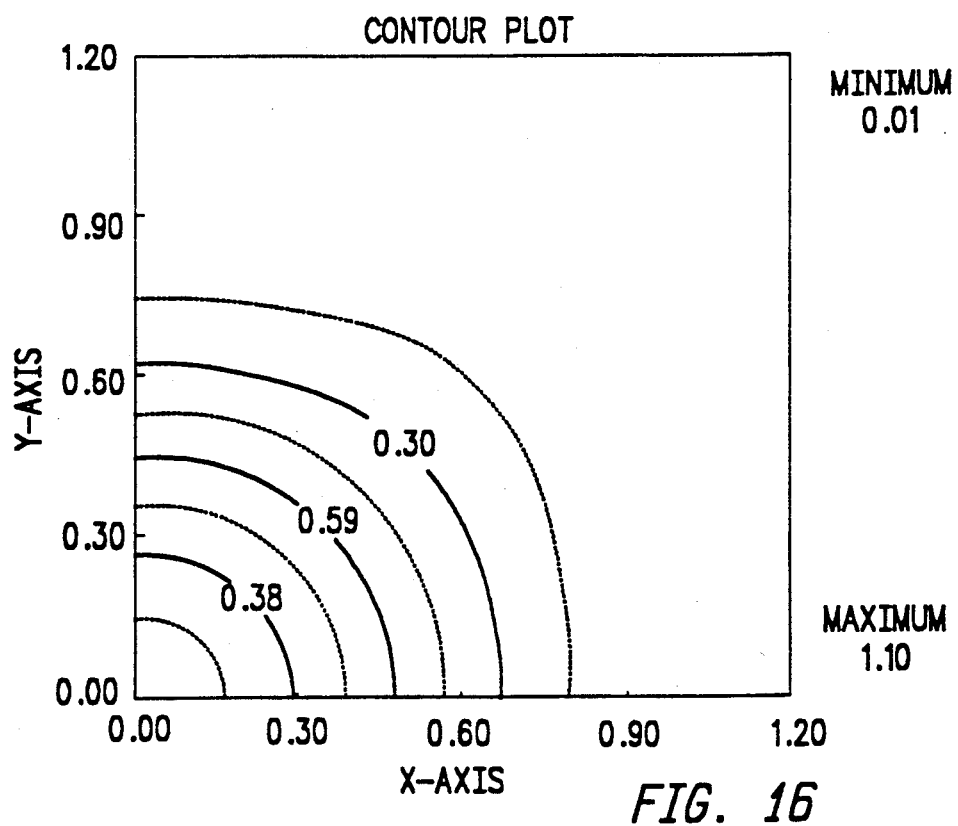
FIG. 16 is a contour plot showing the output intensity distribution of the designed phase-shifting mask of FIG. 15 under partial coherent illumination.
Figure 17:
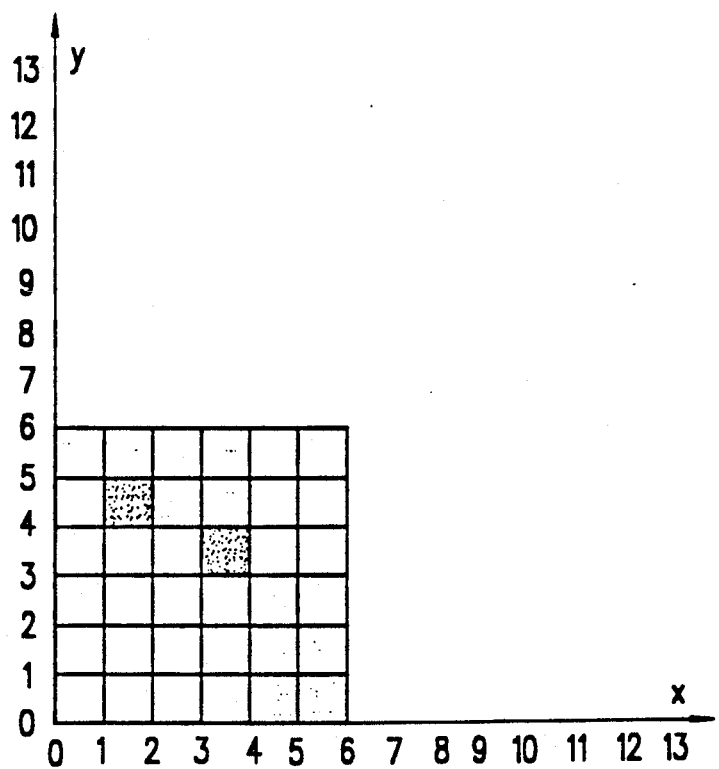
FIG. 17 is a designed phase-shifting mask for the corner of FIG. 11 using a simulated annealing algorithm in the adjusting step of the present invention.

FIG. 15 shows a phase-shifting mask for the corner of FIG. 11 designed using an iterative method (briefly discussed above) in the adjusting step and FIG. 16 is a contour plot of the output intensity distribution of the mask of FIG. 15 under partial coherent illumination. FIG. 17 is a phase-shifting mask for the corner of FIG. 11 using a simulated annealing algorithm in the adjusting step of the present invention. FIG. 18 is the contour plot of the output intensity distribution of the mask of FIG. 17 under partial coherent illumination. By comparing FIG. 16 with FIG. 18, it can be observed that the contour plot of FIG. 18 is sharper and more defined than the contour plot of FIG. 16.

In each case, it has been shown that the adjusting step of the present invention, whether it uses the branch and bound algorithm, the iterative method or the simulated annealing algorithm, provides an improved mask.

Figure 21:
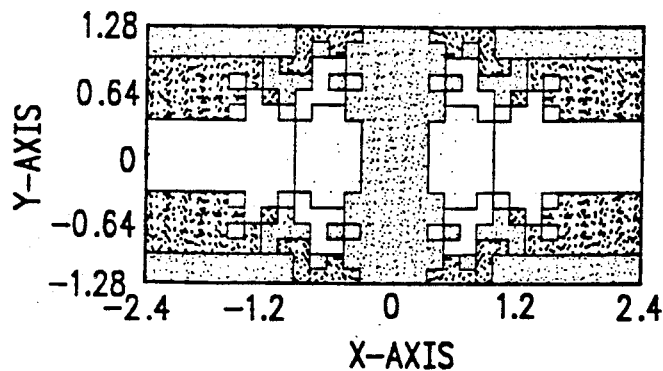
FIG. 21 shows a designed 3-phase-level phase-shifting mask for a phase connection mask having the same configuration as that of FIG. 19.
Figure 22:
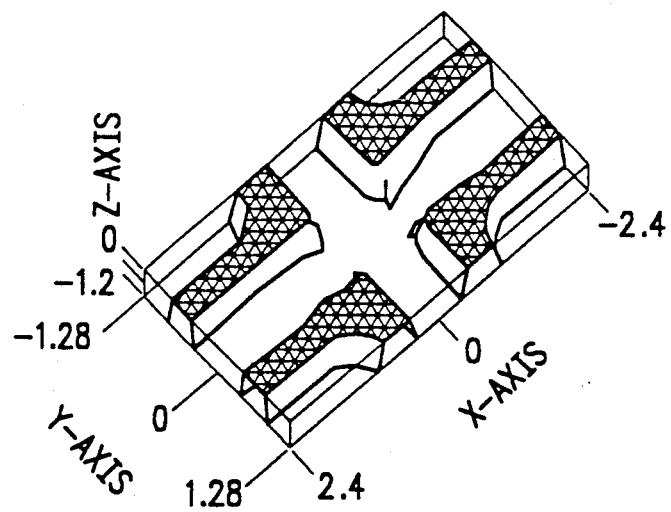
FIG. 22 shows a simulated developed resist profile from the phase-shifting mask of FIG. 21.

Similar comparisons can be made by observing FIGS. 19-22. FIG. 19 shows a simple 0°/180° phase connection of a phase-shifting mask with a 90° phase. FIG. 20 shows a simulated three-dimensional model of a developed resist profile of the mask of FIG. 19 having an undesirable bridge between the walls of the pattern. On the other hand, FIG. 21 shows a phase-shifting mask for the same phase connection of FIG. 19 using simulated annealing in the adjusting step of the present invention and FIG. 22 shows a simulated three-dimensional model of a developed resist profile of the mask of FIG. 21. By comparing FIG. 20 with FIG. 22, it can be observed that the developed resist profile of FIG. 22 is sharper and more defined that the profile of FIG. 20. Furthermore, and most importantly, the undesirable bridge of FIG. 20 has been eliminated in the mask made by the method of the present invention.

The branch and bound algorithm is more sophisticated than the simulated annealing algorithm in that it can find absolute minimum or maximum, and the threshold constraints are completely satisfied for any obtained solution, however, its implementation is more involved than the simulated annealing algorithm. In particular, it implementation for the case of partial coherent illumination depends on an explicit functional form. On the other hand, while simulated annealing is easy to implement as it does not depend on the form of the objective function, and the relation between pixel variable and the objective function can be an implicit function, simulated annealing does not guarantee that all the constraints are satisfied. Moreover, proper weights on sampling points need to be chosen in order to obtain acceptable results. Furthermore, the computation time could be longer than the branch and bound algorithm and the cooling schedule requires fine tuning. Nothless, the simulated annealing formulation is very versatile and can handle factors allowing optimization in more than one focal plane.

The method of the present invention is extendable to beyond a first focal plane. For thick resist or small features, by defining the total objective function to represent three dimensions, the depth of focus of the output image of the mask can be extended to include the entire resist layer.

The present invention optimizes a total objective function which depends on the quality of light intensity at a number of optical planes rather than just the focus plane. Contrary to the belief that higher contrast implies larger depth of field (DOF), the adjusting step of the present invention can trade-off contrast in focus plane with contrast and line width control at defocus planes. This, in turn, results in more uniform intensity profiles across various defocus planes.

Figure 31:
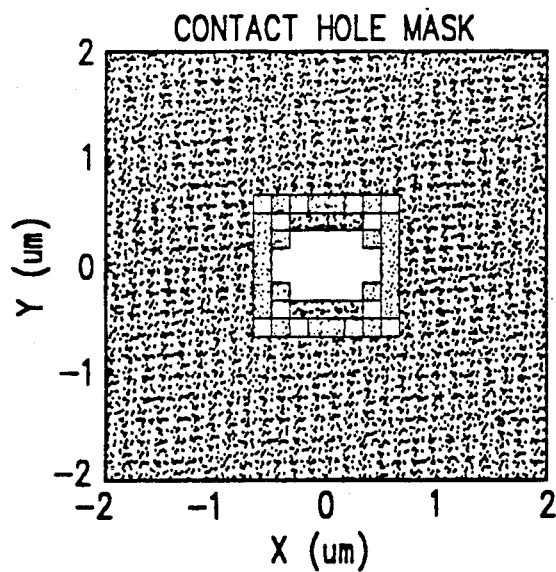
FIG. 31 graphically depicts the contact hole size of the mask of FIG. 30.
Figure 32:
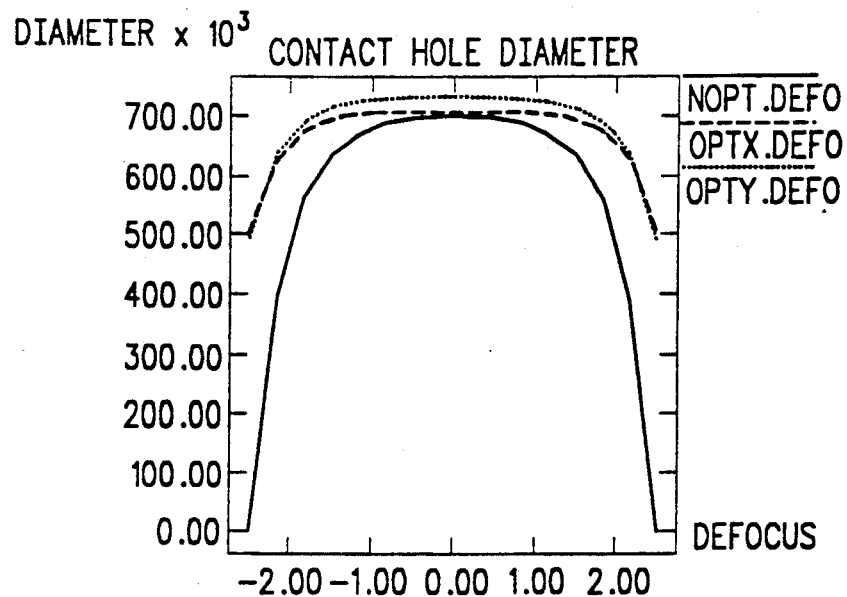
FIG. 32 shows a phase-shifted contact hole mask with a focus plane shift.

Furthermore, a mask with a plane shifted by a certain amount, if not limited by physics of the situation, can be designed by the method of the present invention by implicitly making the demand in the input at step numbered 121 of FIG. 2. For example, the mask as shown in FIG. 31 is optimized for $z = -0.5, 1.0, 2.5$ μm, optical planes with $k = (1,0,0)$ resulting in a desired shift of 1.0 μm in the focus plane as seen in FIG. 32.

Accordingly, the error function is defined such that it measures the amount of violation of the inequalities of Eq. 1 at each spatial point $\vec{x}_k$ on each optical plane μ:

$$e_k^\mu(I^\mu(\vec{x}_k, \vec{q})) = \begin{cases} I^\mu(\vec{x}_k, \vec{q}) - a & \text{if } \vec{x}_k \in A \\ b - I^\mu(\vec{x}_k, \vec{q}) & \text{if } \vec{x}_k \in B \\ I^\mu(\vec{x}_k, \vec{q}) - c & \text{if } \vec{x}_k \in C \\ d - I^\mu(\vec{x}_k, \vec{q}) & \text{if } \vec{x}_k \in D \end{cases} \quad \text{Eq. 10}$$

The superscript $\mu = 1,....$ P denotes the μth optical plane, k is the index for sampling points, $\vec{q}$ is the vector of unknown pixel variables which represents the mask pattern to be optimized.

Let the local cost function at spatial point K in region i on optical plane μ be denoted by $h_i^\mu(e_k^\mu)$. We combine the local cost functions at different optical planes in a pointwise fashion to obtain a combined local cost function Z at spatial point K, $$Z(h_i^1(e_k^1), h_i^2(e_k^2),...,h_i^P(e_k^P)) \quad \text{Eq. 11}$$

where i=A,B,C or D represents the region that the sampling point belongs to.

Finally, we define the total cost function to be the sum of combined local cost functions at each spatial point:

$$H(\vec{q}) = \sum_i \sum_{k \in i} Z(h_i^1(e_k^1(I^1(\vec{x}_k, \vec{q}))), h_i^2(e_k^2(I^2(\vec{x}_k, \vec{q}))), ..., \quad \text{Eq. 12}$$

$$h_i^P(e_k^P(I^P(\vec{x}_k, \vec{q}))))$$

where k∈i means that the sampling point k is in region i, with i=A,B, C or D.

Design of Cost Function

As seen in Eq. 11 and 12, the total cost function H consists of a summation of the function Z's, which combines local cost functions $h_j^\mu(e_k^\mu)$. It can be argued that rather than designing Z and $h_j$ separately, one could directly design a total cost function Z as a function of errors $e_k^\mu$ to combine errors at different sampling points and on different optical planes simultaneously. However we have chosen to separate the total cost function into a local cost function and a combination function for different optical planes in order to trade-off intensity patterns at various optical planes easily. For example, by giving more weight to the error in the focal plane, we can ensure a more desirable pattern at the focal plane at the expense of less desirable ones in defocus planes. In the remainder of this section, we will describe our choice of local function $h_j^\mu(e_k^\mu)$ and the combination function Z.

The Local Cost Function

The local cost function is used to measure the degree of violation at different spatial points on the same optical plane. Ideally a local cost function should (a) penalize violations of constraints in inequalities 1 through 4, (b) detect intensity dips at phase transition areas, (c) allow the optimization algorithm to correct the dips, (d) result in a uniform violation of the constraints. To satisfy these properties, we device the following guidelines for the construction of local cost function:

1. The user should not have to deal with constraints on a point by point basis. Rather, the relative importance of contours A and B, and regions C and D should be controllable.
2. There should be a large penalty for constraint violations but none or small penalty if the constraints are satisfied.
3. Local large violations such as dips in phase connectors should be less desirable than the sum of many small violations. As a consequence, given a fixed total amount of violations, a uniform violation among different sampling points is more desirable than non-uniform violations.
4. Linewidth control is more important than contrast enhancement if enough contrast is achieved, but less important than contrast if there is not enough contrast.
5. Since the developed resist edges are usually close to 0.3 intensity contours, there is less margin for violations in dark field region than in bright field region. For the pattern in FIG. 3, this implies less margin for violations in domain C and on contour A than in domain D and on contour B.

For convenience of discussion, we consider only one optical plane, P=1, with two sampling points, and with a total cost function of two variables $H=H(e_1, e_2)$, where $e_1$ and $e_2$ are error functions at two different spatial points. We assume that the functions H and h are differentiable and we note from Eq. 12 that $$\frac{\partial H}{\partial e_k}\bigg|_{e_1,e_2} = \frac{\partial h}{\partial e_k}\bigg|_{e_k}, \text{ for } k = 1, 2.$$

The desired properties of H and hence h are:

$$\frac{\partial h}{\partial e_k} \geq K(e_k), \text{ for } e_k \geq 0 \quad k = 1, 2; \qquad \text{Eq. 13}$$

$$\frac{\partial h}{\partial e_k} \ll K(0^+), \text{ for } e_k \leq 0 \quad k = 1, 2; \qquad \text{Eq. 14}$$

$$\frac{\partial h(u,v)}{\partial v}\bigg|_{u=constant} \geq 0 \text{ for } v > 0 \qquad \text{Eq. 15}$$

$$\frac{\partial h(u,v)}{\partial v}\bigg|_{u=constant} \leq 0 \text{ for } v < 0 \qquad \text{Eq. 16}$$

where $\mu - v$ are the Cartesian coordinates obtained by rotating the $e_1 - e_2$ coordinates 45° counter clockwise.

We now describe the way guidelines 1-5 are related to desired properties in inequalities 13-16. Guideline 2 requires h to be monotonically increasing, or equivalently $K(e_k)$ to be positive for all $e_k$. The "<<" sign in inequality 9 also reflects guideline 2. Guideline 3 requires $K(e_k)$ to be an increasing function of $e_k$ in regions C and D. Equations 15 and 16 enforce h to be at minimum when $e_1 = e_2$ and to increase with $|e_1 - e_2|$ for a fixed $e_1 + e_2$. Thus Eq. 15 and 16 are in compliance with guide-line 3. Since contrast is related to error in regions C and D, and linewidth control is related to error on contours A and B, guideline 4 implies that for small $e_k$, we must have $h_A > h_C$ and for large $e_k$, we must have $h_C > h_A$.

One way to achieve guidlines 3 and 4 would be to choose $K(e_k)$ to be a positive constant for A and B and to be an increasing exponential for C and D. In fact, we have chosen $K(e_k)$ in this way to design a set of local cost functions as follows:

$$h_i(e) = e \quad \forall e \leq 0; \ i = A,B,C,D \qquad \text{Eq. 17}$$

$$h_A(e) = Qem_c/t_{c2} \quad \forall e > 0 \qquad \text{Eq. 18}$$

$$h_B(e) = Qem_d/t_{d2} \quad \forall e > 0 \qquad \text{Eq. 19}$$

$$h_C(e) = a_c(e^{bce} - 1) \quad \forall e > 0 \qquad \text{Eq. 20}$$

$$h_D(e) = a_d(e^{bde} - 1) \quad \forall e > 0 \qquad \text{Eq. 21}$$

where $Q = aN_A + cN_C + (2-b)N_B + (2-d)N_D$ is a bound for negative contributions to the total cost function, $N_A$, $N_B$, $N_C$ and $N_D$ denote the number of points in regions A, B, C and D respectively, the t parameters are directly related to the resist characteristics, $m_c$ and $m_d$ are parameters that control the growth rate of the cost functions, and $a_c$, $b_c$, $a_d$ and $b_d$ are functions of t and m parameters as will be explained shortly.

Figure 23:
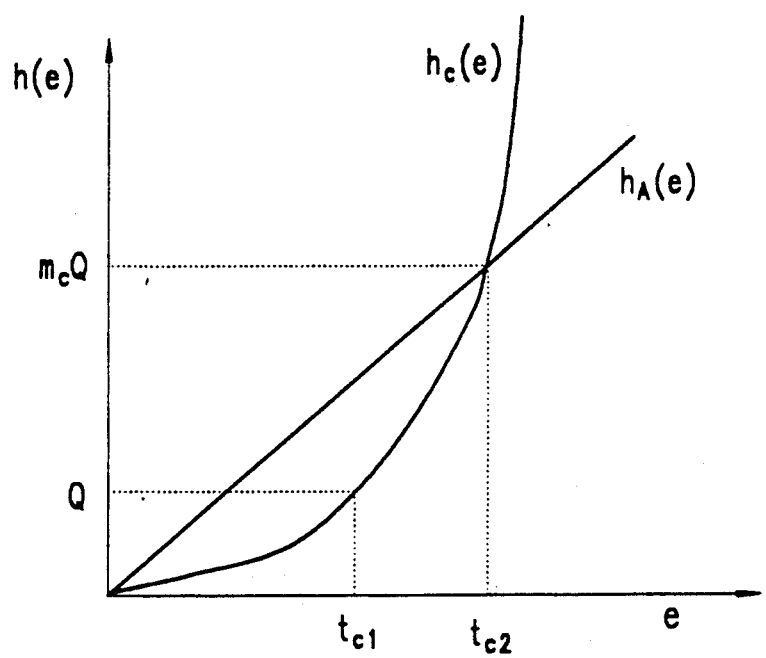
FIG. 23 graphically depicts the local cost function for contour A and region C.

We impose the relationship shown in FIG. 23 between $h_A$, $h_C$, $t_{c1}$, $t_{c2}$, Q and $m_c$. As seen, the error for region C, $h_C(e)$, and the error on contour A in region C, namely $h_A(e)$, intersect at $e = t_{c2}$. For small values of error, namely $e < t_{c2}$, $h_A(e)$ is larger than $h_C(e)$, emphasizing the importance of linewidth control over contrast. For large values of error, namely $e > t_{c2}$, $h_C(e)$ is larger than $h_A(e)$, emphasizing contrast over linewidth control. Thus, the shape of $h_C$ and $h_A$ shown in FIG. 23 is in compliance with the requirements of guideline 4. The relation between $h_B$ and $h_D$ are similar to that of $h_A$ and $h_C$.

Given the growth rate $m_c$ and the parameters $t_{c1}$ and $t_{c2}$ in FIG. 23, we can determine the paramenters $a_c$ and $b_c$ in the following way, $$b_c = \frac{1}{t_{c2}} \ln[m_c(e^{bc t_{c1}} - 1) + 1] \qquad \text{Eq. 22}$$

$$a_c = Q/(e^{b c t c 1} - 1).\qquad \text{Eq. 23}$$

Equation 21 can be solved by an interactive scheme using the expression itself with initial guess $b_c = \epsilon$, where $0 < \epsilon < 1$. Under this condition, convergence to the root can be guaranteed. $a_d$ and $b_d$ in Eq. 21 are determined in a similar fashion to $a_c$ and $b_c$.

The set of cost functions defined in Eq. 18-21 can be further modified according to different applications in order to allow trade-off between linewidth control and contrast, by multipling different constants $\lambda_i$ with different local cost functions $h_i(x)$. The parameters we use in most of our simulations shown below are $a=0.25$, $b=0.35$, $c=0.15$ and $d=0.75$, $m_c = m_d = 2.2$, $\lambda_a = \lambda_b = 2.2$, $=\lambda_b 2.2$ and $\lambda_c = \lambda_d = 1$; $t_{d1} = 0.1(d-c)$, $t_{d2} = 0.2(d-c)$, $t_{c1} 0.07(d-c)$ and $t_{c2} = 0.14(d-c)$. The relative values of these t parameters reflect the requirement in guideline 5. The local cost functions corresponding to the above parameters are readily calculable.

Choice of Combination Function

The choice of combination function is similar to that of local cost function. Since the local cost function can possess most of the desirable properties required for the total cost function H, we only need to be concerned about the uniformity property in choosing the combination function.

Figure 24:
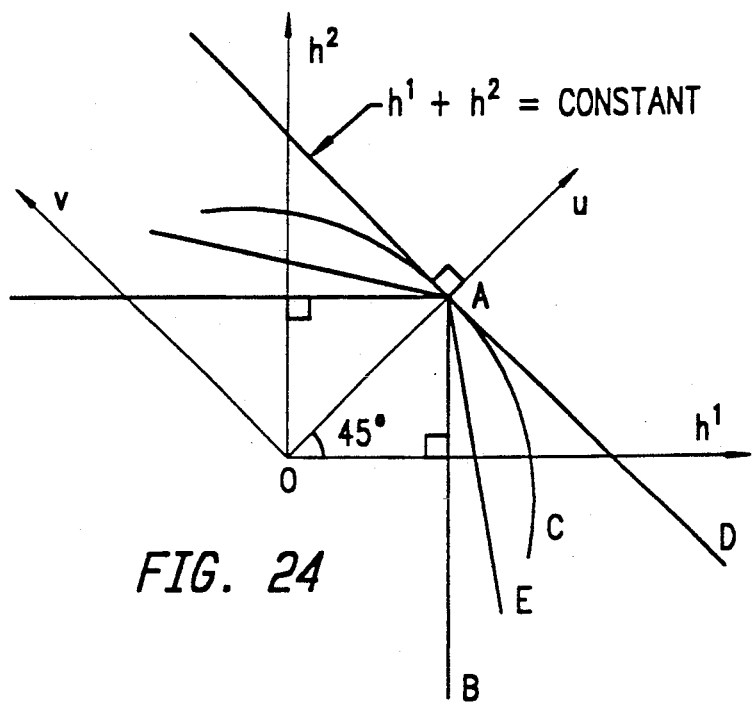
FIG. 24 shows a partition of the domain of the combination function Z.

For convenience of discussion, we consider a combination function of two variables $Z = Z(h^1, h^2)$, where $h^1$ and $h^2$ are local cost functions at the same spatial point on different optical planes. It is natural to require Z to be symmetrical with respect to variables $h^1$ and $h^2$. Clearly it is also desirable that Z be monotonically increasing with respect to $h^1$ and $h^2$. A necessary requirement for uniformity is $$\frac{\partial h^\mu(u,v)}{\partial v}\bigg|_{u=constant} \geq 0 \text{ for } v > 0, \mu = 1, 2 \qquad \text{Eq. 24}$$

$$\frac{\partial h^\mu(u,v)}{\partial v}\bigg|_{u=constant} \geq 0 \text{ for } v < 0, \mu = 1, 2 \qquad \text{Eq. 25}$$

where $u - v$ are the Cartesian coordinates obtained by rotating the $h^1 - h^2$ coordinates 45° counter clockwise, as shown in FIG. 24. Equations 24 and 25 imply that a uniform image profile along different optical planes is favored and non-uniformity results in an increase in the cost function.

As shown in FIG. 24, for a given constant u corresponding to the point A on the u axis, we draw the line AB which is perpendicular to the $h^1$ axis, and the line AD which is perpendicular to the u axis. Since Z is a monotonically increasing function of $h^2$, it monotonically increase from point B to A. Furthermore, since the uniformity constraint of Eq. 24 requires Z to increase monotonically from A to D, the isocontour curve AC of combination function Z that passes through point A must lie within the triangle area ABD. In fact, the isocontour curve AC characterizes the combination function. When AC is close to AD, the combination function Z is close to $h^1 + h^2$, and uniformity is not emphasized. When AC is close to curve AB, the combination function nearly corresponds to the larger of $h^1$ and $h^2$, and uniformity of image along optical axis is emphasized. In fact, the AB curve corresponds to $Z = \max\{h^1, h^2\}$ and results in a min-max optimization problem, which is more difficult to solve than the resulting optimization problem due to AD curve.

For implementation purposes, we propose to use a combination function which is close to the AB line and is simple to implement. To be specific, we first sort $h_i^\mu(e_k^\mu)$ into descending order:

$$h_i^1(e_k^1) \geq h_i^2(e_k^2) \geq, \ldots, \geq h_i^P(e_k^P) \qquad \text{Eq. 26}$$

$$\mu = 1, \ldots, P.$$

we then combine them as follows:

$$Z(e_k^1, e_k^2, \ldots, e_k^P) = \sum_{\mu=1}^{P} \kappa_\mu h_i^\mu(e_k^\mu) \qquad \text{Eq. 27}$$

where $\kappa_1 \geq \kappa_2 \geq, \ldots, \geq \kappa_P$. If $\kappa_\mu = 0$ for all $\mu$ except for $\kappa_1 = 1$, then the above combination function corresponds to a min-max problem. If $P = 2$, the combination function in Eq. 27 is characterized by the line AE with slope $$-\frac{\kappa_1}{\kappa_2}.$$

Figure 25:
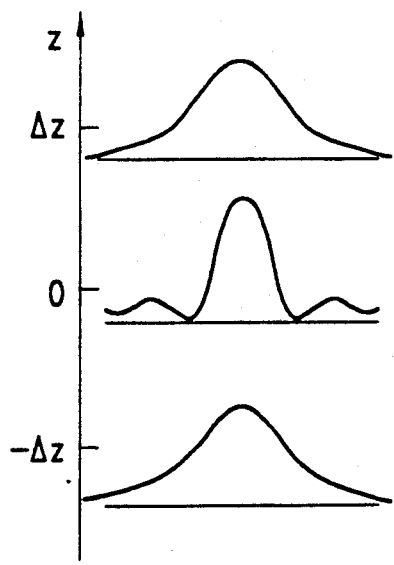
FIG. 25 depicts intensity profile variations at different optical planes; left, due to a conventional or phase-shifting mask; right, the ideal distribution.
Figure 25:
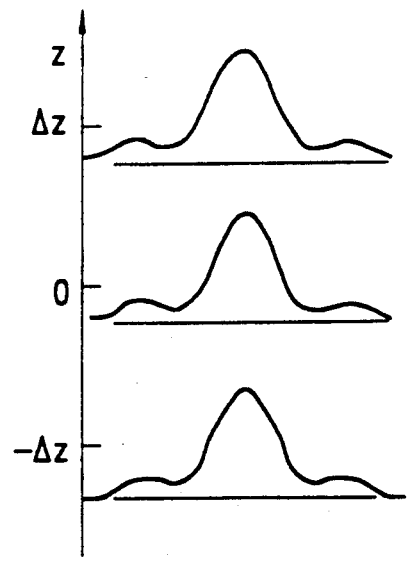

The design examples shown in this paper are all obtained by using the AB curve. The min-max criterion in effect leads to more uniform intensity image distribution along the optical axis at the expense of contrast at focal plane, as shown in FIG. 25. This should change the traditional wisdom, that higher contrast at focus plane implies larger depth of focus.

As a matter of fact, algorithm of the adjusting step takes the extra intensity amplitude or contrast in focus plane to enhance the intensity amplitude or contrast at defocus, shown in FIG. 25.

Optimization at different optical planes is computation intensive. Basic SA algorithms such as those usually used are primitive and have obvious drawbacks. To increase the speed, we propose two measures. Our first measure has to do with the fact that at very low temperature, the state bounces back and forth for a long time before it finally settles down to a local minimum. To avoid this problem, we compare the maximal change of total cost function in a single move at each temperature to the difference between the maximum and minimum cost of states at that temperature. When they are comparable, say less than 0.1% in difference, we set the temperature to zero and start a simple iterative algorithm. The transmittance of each of the mask pixels are then changed one by one; when all the pixels have been visited in a row without causing reduction in the cost, the optimization process is terminated.

Our second measure has to do with the fact that when using a simple cooling schedule, at high temperatures the state bounces back and forth, and therefore it is hard to detect the existence of equilibrium. Intuitively there is no equilibrium unless the temperature reduction rate is very slow compared to the rate of visiting different states in the solution space. Since the simulation of imaging system in each iteration is time consuming, we can not afford to visit a large number of states, and any practically affordable annealing process cools "too fast". In view of this, we suggest the decision to reduce the temperature should be based on the position of the state of energy surface rather than the time spent on previous temperature. Hence we propose a new rule for termination of Markov chains at each temperature.

Let H denote the random variable for total cost function at certain temperature with expectation $\nu$ and the standard deviation $\sigma$. Clearly H follows Boltzmann distribution, and $\nu$ and $\sigma$ are functions of temperature. Our proposed new rule terminates a Markov chain as follows: whenever the cost of the current state falls into within $\pm 0.5\sigma$ of the expectation $\nu$ of the cost H at current temperature, we conclude that a "good" position is reached and the Markov chain at that temperature is terminated. To avoid fluctuations of estimates of $\sigma$, $\sigma_{l-1}$ for temperature $T_{l-1}$ is used as an estimate of $\sigma_l$ for temperature $T_l$. To estimate the expectation $\nu_l$ at temperature $T_l$, a running average is computed with a weight function that emphasizes recent observations more than earlier ones in order to reduce transient effects due to temperature change. To be specific, we define the running average as follows, $$H_n = \frac{\sum_{i=1}^{n} p_i H_i}{\sum_{i=1}^{n} p_i} \quad \text{Eq. 28}$$

when n is the number of moves made at temperature $T_l$, $H_n$ is the total cost after n moves under temperature $T_l$ and the weighting coefficients are chosen to be $p_i = 1 - \rho^i$, with $\rho$ being a parameter to be determined. By simple manipulation, we obtain a convenient form $$H_n = \frac{M_n}{D_n} = \frac{M_{n-1} + H_n(1 - \rho^n)}{D_{n-1} + (1 - \rho^n)} \quad \text{Eq. 29}$$

where $M_n$ and $D_n$ are the numerator and denominator of equation 24 respectively. We denote the number of pixel variables by n and estimate the transient time to be $$N_1 = \sqrt{\text{neighborhood size}} = \sqrt{\text{\# of levels} \times N} \text{ by speculation.}$$

Figure 26:
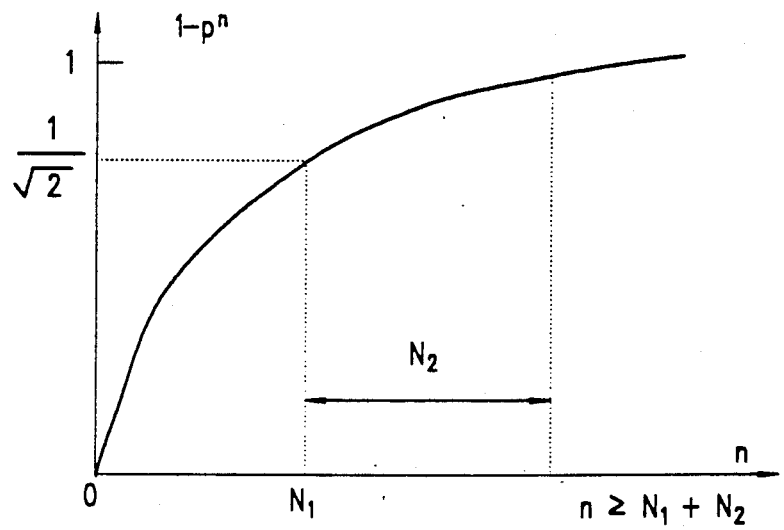
FIG. 26 graphically depicts the weighting function for the running average of the total cost function.

The parameter $\rho$ can be determined by setting the damping factor to be $1/\sqrt{2}$ at the end of transient time $N_1$, as shown in FIG. 26:

$$(1 - \rho^{N_1}) = \frac{1}{\sqrt{2}} \rightarrow \rho = 0.29289^{\frac{1}{N_1}} \quad \text{Eq. 30}$$

To avoid termination of Markov chains pre-maturely due to lack of samples for meaningful statics, we set up a buffer time before the test for "good" positions can be started. Specifically, we wait for $N_1$ cycles for the transients to die out and for $N_2$ cycles to obtain meaningful statistics. We estimate $N_2$ using Chebyshev's inequality. Let $H_i$ be the random variable represent the total cost function of the $i^{th}$ accepted state at certain temperature. Strictly speaking, $H_i$, i=1,2,... are not independent identically distributed (iid) random variables, but as a good approximation, we assume they are iid with expectation $\nu$ and standard deviation $\sigma$. Let $\bar{H}_n$ denote the random variable representing a simple average of $H_i$, i=1,2,...,n, and $\bar{H}_n$ denote a sample of $H_n$. Then the expectation and standard deviation of $\bar{H}_n$ are $\nu$ and $$\frac{\sigma}{\sqrt{n}}$$

respectively. By Chebyshev's inequality $$P\{|X - \nu_x| > \delta\} \leq \frac{\sigma_x^2}{\delta^2} \quad \text{Eq. 31}$$

where $\nu_x$ and $\sigma_x$ are the mean and standard deviation of random variable X. Applying this to $\bar{H}_n$ we obtain $$\epsilon = P\{|H_n - \nu| > \delta\} \leq \frac{\rho^2}{n\delta^2} \quad \text{Eq. 32}$$

Limiting the error in estimation of $\nu$ to half the standard deviation of $H_i$, i.e. $\delta = \sigma/2$, then $\epsilon \leq 4/n$. If we want $\epsilon \leq 0.1$, we can choose $n \geq 40$ or $N_2 \geq 40$. We note that the running weighted average is different from a simple average, but they are very close after $N_1 + N_2$ cycles.

In summary, we do not start testing whether a "good" position is reached until $n \geq N_1 + N_2$. After that time, if at any step $|H_n - \bar{H}_n| \leq 0.5\sigma_{l-1}$, the the Markov chain is terminated for temperature $T_l$ and the temperature is reduced. On average, the effects of the two measures described in this section result in more than doubling the speed of the optimization process without deteriorating the equality of solutions.

Figure 27:
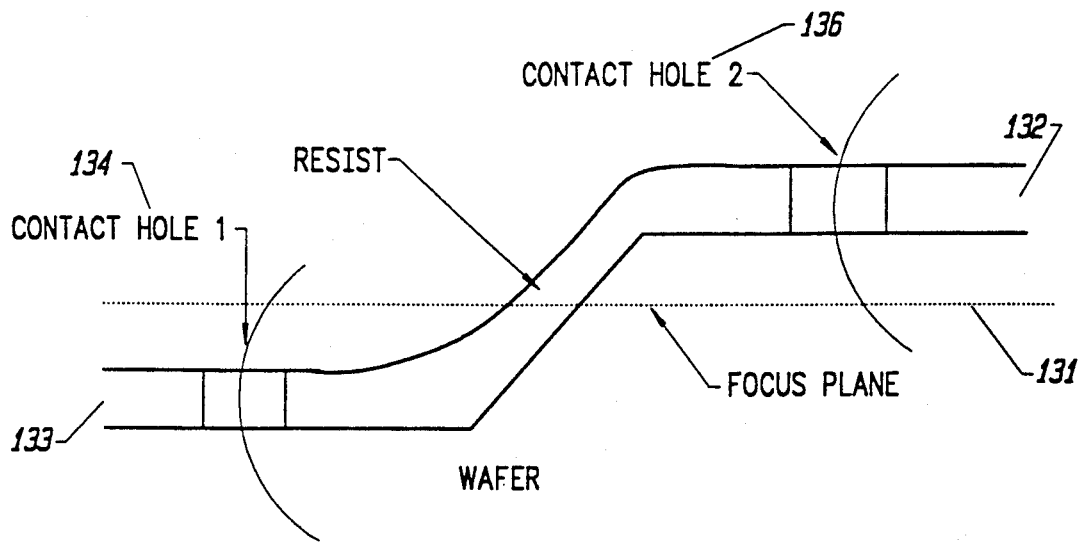
FIG. 27 shows a wafer having contact holes on an uneven resist topology where focusing shift of the present invention can be useful.
Figure 28A:
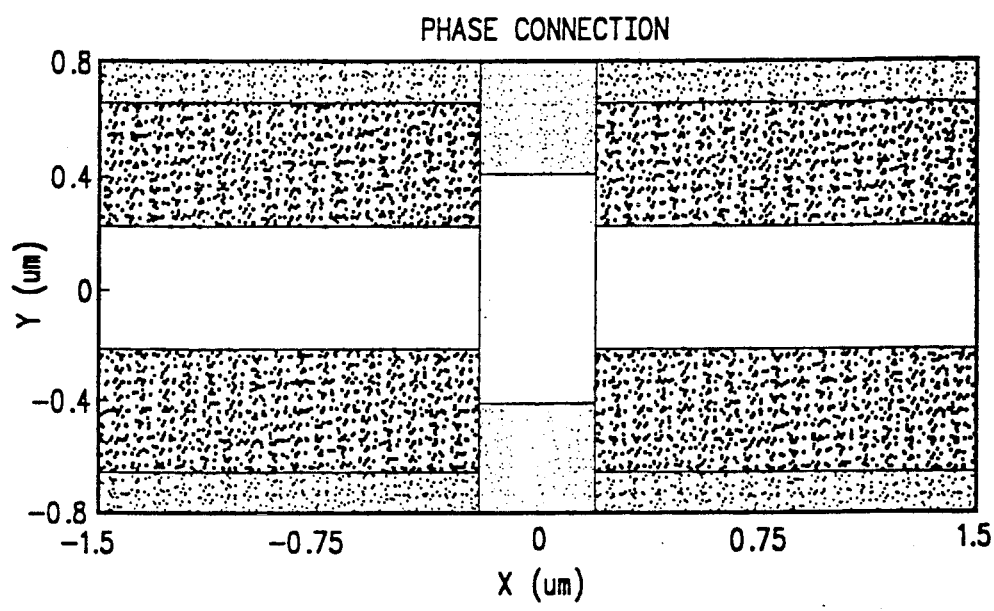
FIG. 28 shows a simple $0°-60°-120°-180°$ cross phase connector mask and the intensity distribution at different focus planes.
Figure 28B:
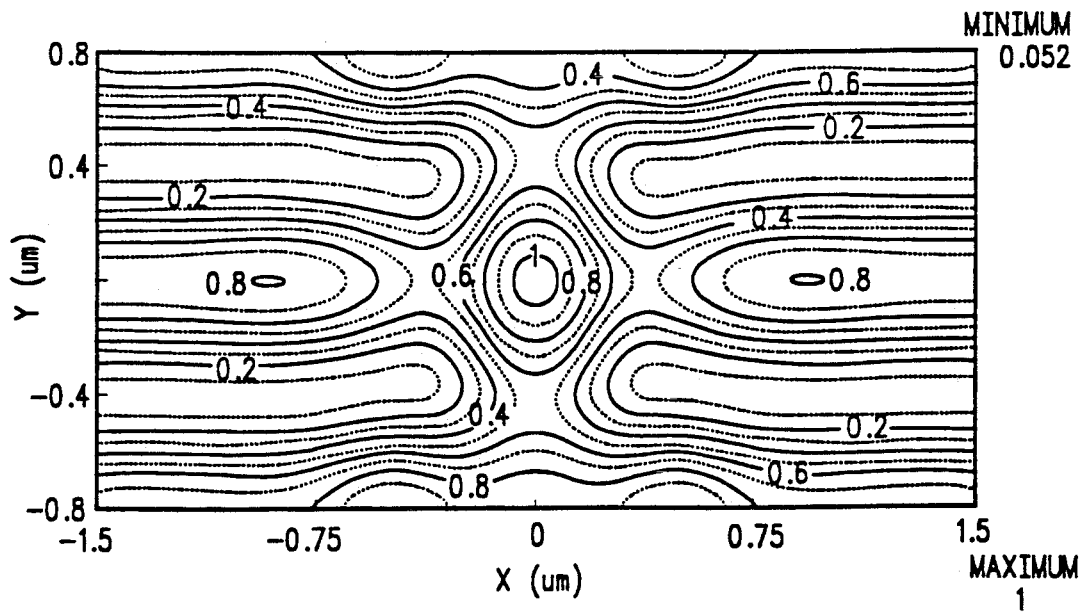
Figure 28C:
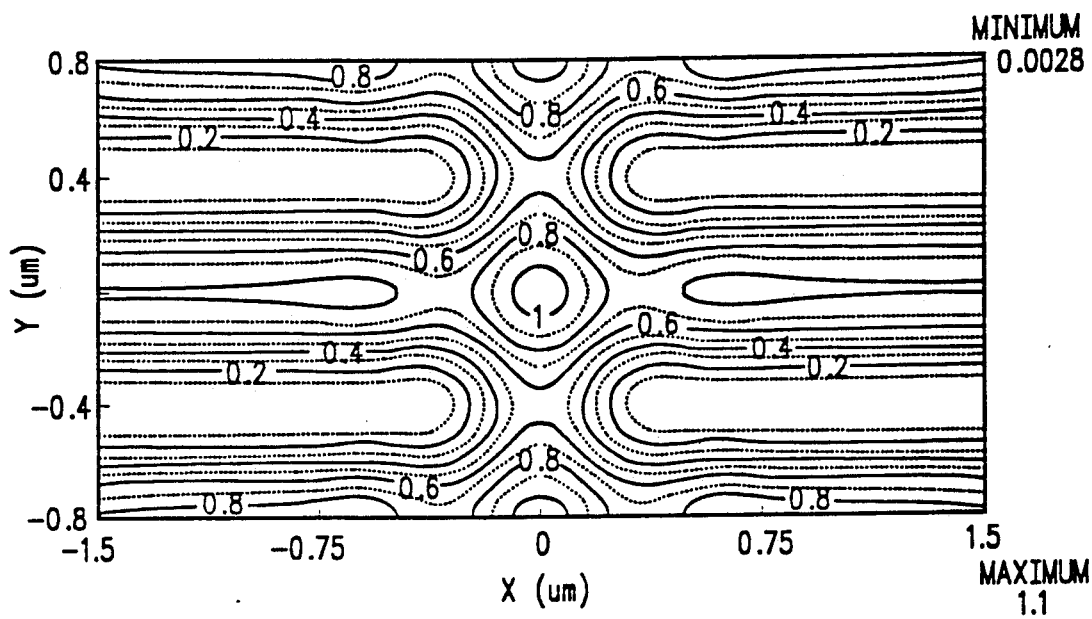
Figure 28D:
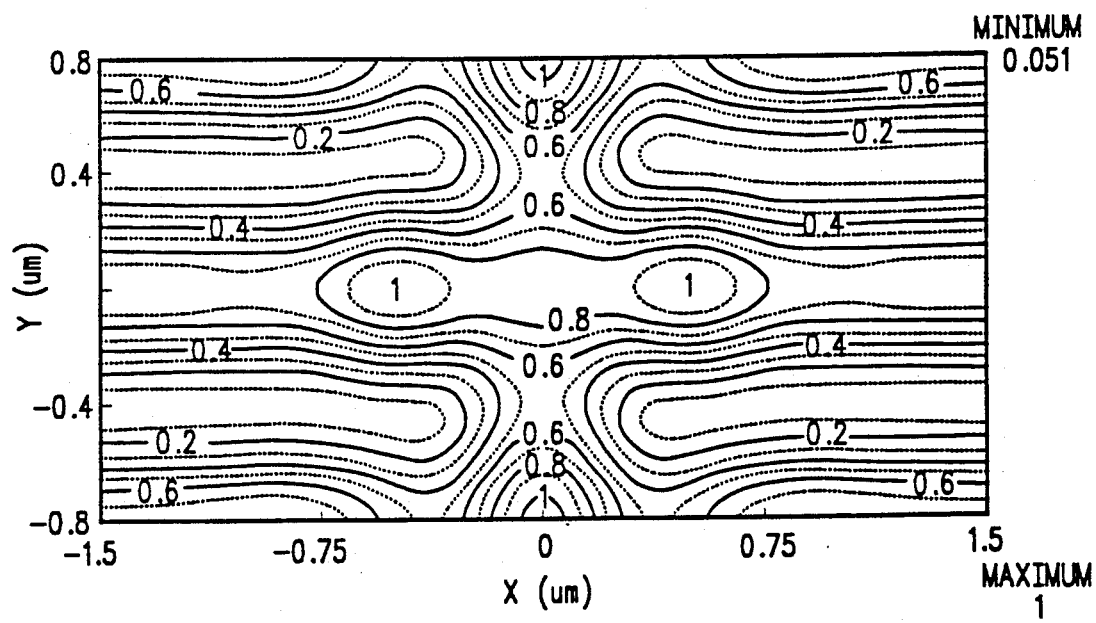
Figure 29A:
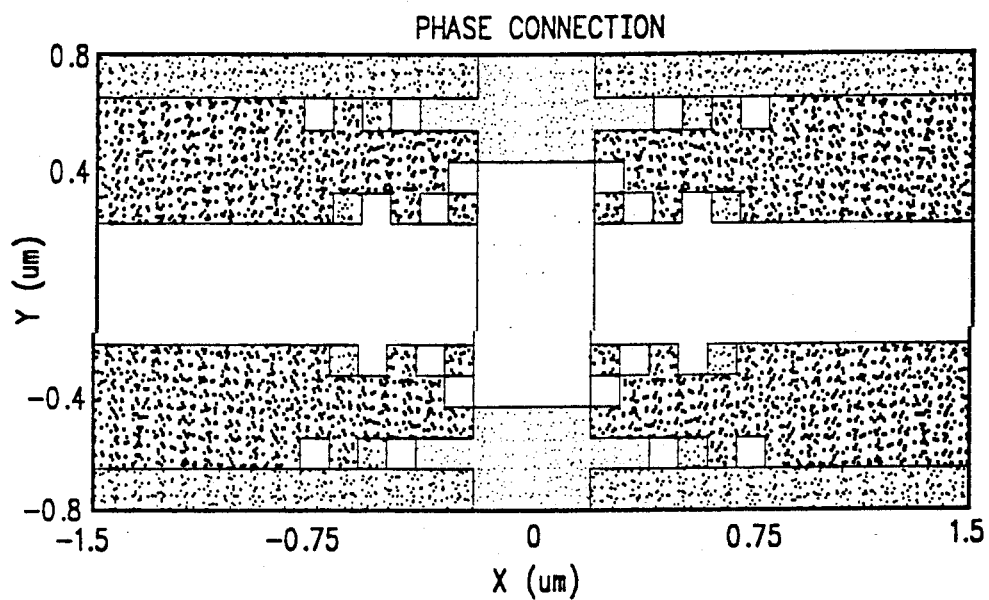
FIG. 29 shows a designed phase-shifting $0°-60°-120°-180°$ cross phase connector mask and the intensity distribution at different focus planes.
Figure 29B:
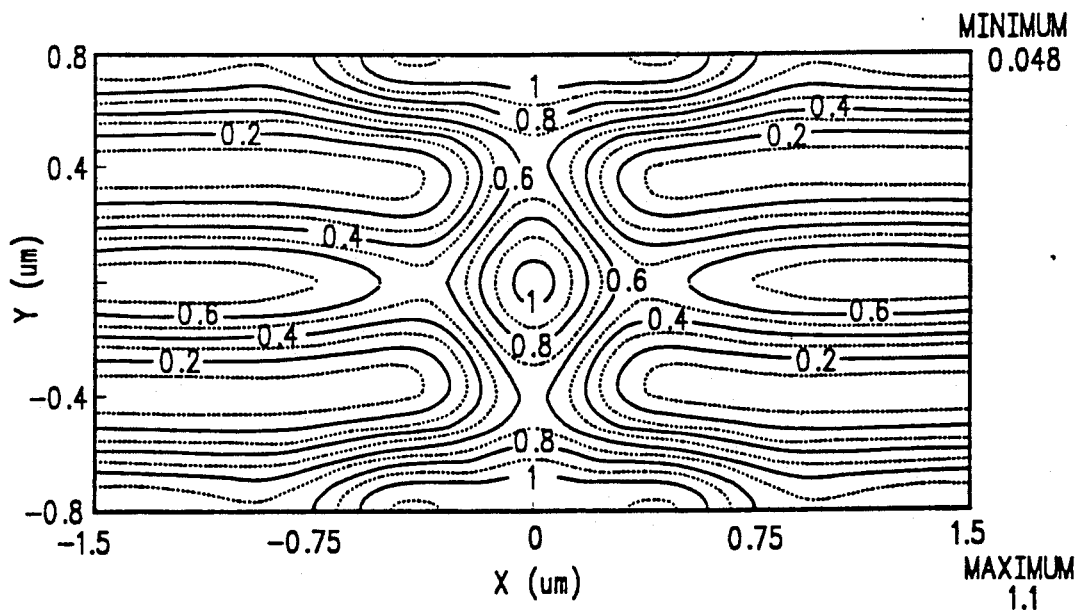
Figure 29C:
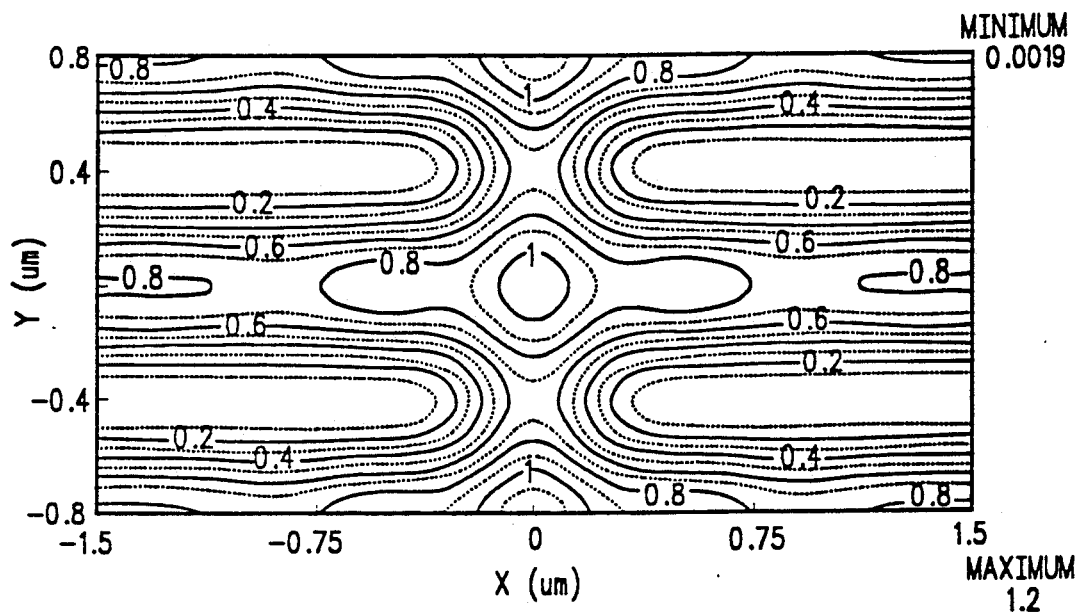
Figure 29D:
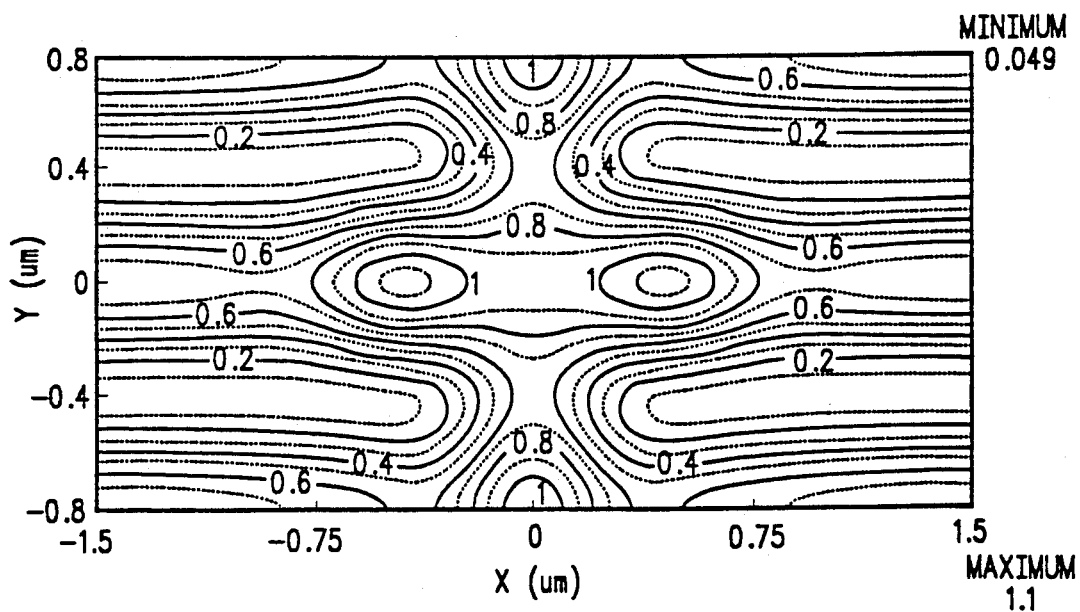

The benefits of the method of the present invention to extend the optimization beyond a first focal plane is illustrated in FIG. 27. By defining the total objective function to represent three dimensions, optimization of three planes is possible, and therefore the output image of the mask can be extended to include uneven resist topology. FIG. 27 shows a first focal plane 131 and two other focus planes (defocus) 132 and 133. Therefore, contact holes 134 and 136 can be patterned by the same mask even though the topography of the resist is critically uneven.

The present invention provides an automated optimization method that includes three dimensional focusing effect. Equipped with this tool, previously problematic mask designs can be manufactured more reliably and efficiently than by previous trial and error methods.

FIGS. 28-33 illustrate the benefits of the present invention's ability to be extendable into three dimensional design configurations. For example, FIG. 28(a) shows a simple 0°-60°-120°-180° cross phase connection designed without the present invention. FIGS. 28(b)-(d) show intensity distribution at the focus and two different defocus planes. There is a variation of intensity distribution between FIGS. 28(b)-(d). However, as shown in FIG. 29, a mask designed in accordance with the present invention provides an intensity distribution at the focus plane, FIG. 29(c), (b) and (d), which has higher contrast and a more uniform linewidth than those of the defocus planes of FIGS. 28(b), (c) and (d).

Figure 30:
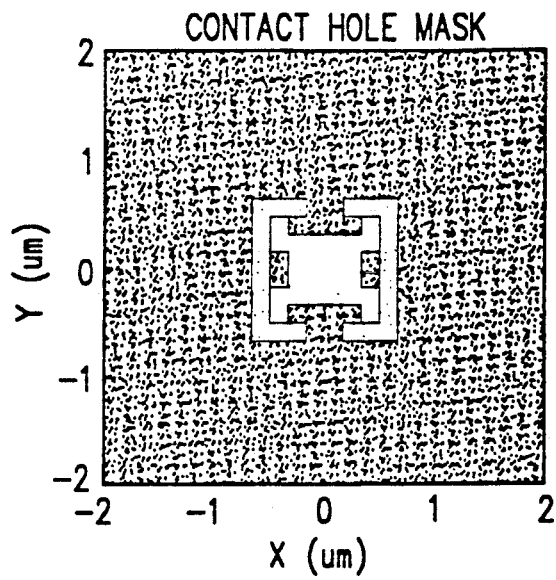
FIG. 30 shows a phase-shifted contact hole mask with no focus plane shift but with an extension of depth of focus.

Moreover, FIGS. 30-33 illustrate the benefits of the DOF extension and focus shifting feature of the present invention. FIG. 30 shows a mask for a 0.68 μm contact hole with no focus plane shift but with an extended DOF. FIG. 32 shows the contact hole sizes for the hole of FIG. 30 (shown by dotted lines) and a convention mask (shown by a solid line). The contact holes of FIG. 30 have a wider flat portion than a conventional mask.

Figure 33:
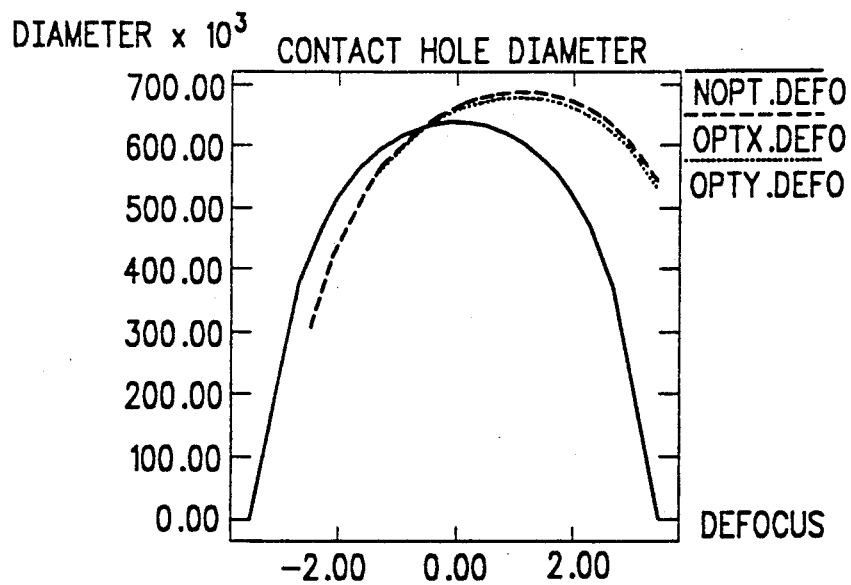
FIG. 33 graphically depicts the contact hole size of the mask of FIG. 32.

FIG. 31 shows a mask for a 0.68 μm contact hole size with a focus shift. FIG. 33 shows the contact hole size and relative position of the hole of FIG. 31 (shown by dotted lines) and a conventional mask (shown by a solid line). The focus shift of the present invention provides a hole with the proper bias.

Finally, after the final mask pattern is generated, the mask pattern is transferred to a mask generating machine which generates the physical mask used in a photolithography or other optical printing process.

In summary, the present invention provides a method for making masks which compensates for optical diffraction, provides for an extended depth of focus and allows a shift of the focus plane. These features are made possible by defining the mask elements in terms which are amenable to formulation as a combinatorial optimization problem. By defining an error function as violations of threshold constraints and creating a non-linear function to represent the cost violations, a simulated annealing algorithm is used in the adjusting step of the present invention. The explanations of the figures disclosed herein show that the present invention can be used with partially coherent illumination which is, typically, otherwise difficult to predict.

While the present invention has been shown and described in what is presently conceived to be the most practical and preferred embodiment of the invention, it will become apparent to those of ordinary skill in the art that many modifications thereof may be made within the scope of the invention, which scope is to be accorded the broadest interpretation of the claims so as to encompass all equivalent structures.

What is claimed is:

1. A method for making a mask for optical lithography or other projection printing, wherein said mask is represented by an initial mask pattern and wherein said mask provides an output image focused on a first focal plane, substantially on the surface of a wafer, said output image having a substantially binary configuration on said wafer, and wherein on said wafer, said image is zero in a first domain and one in a second domain, and wherein as light is applied to said mask, said mask allows light to pass through it and onto a wafer at varying intensities, such intensities represented by output intensity values, the threshold values of which produce said output images within predetermined constraints, said method comprising the steps of:

defining sampling points which are representative of said first and second domains;

defining local objective functions, which include error functions representative of the degree to which said output intensity values of said sampling points are within said predetermined constraints, and which include penalties reflective of the relative importance of each of said regions;

combining said local objective functions to give a total objective function;

adjusting said mask pattern to provide for minimization by optimization of said total objective function;

transferring said mask pattern to a mask generating machine to generate a mask; and generating a mask.

2. A method for designing masks for optical lithography, wherein an initial mask provides an output image having a binary configuration wherein said image is zero in domain A and one in domain B and wherein contour C surrounds the boundaries of A and is in region A and wherein contour D surrounds the boundaries of B and is in region B and wherein said mask has output intensity values, I, at said A, B, C and D, the threshold values of which produce said output images within constraints such that, $$I(\vec{x}) \leq a \quad \vec{x} \in A$$
$$I(\vec{x}) \geq b \quad \vec{x} \in B$$
$$I(\vec{x}) \leq c \quad \vec{x} \in C$$
$$I(\vec{x}) \geq d \quad \vec{x} \in D,$$

and wherein $\vec{x}$ represents spatial location (x,y) and a, b, c and d are corresponding intensity threshold values in regions A, B, C and D respectively, and wherein said mask image is quantized into small square pixels represented by vector of pixel variables $\vec{a}$, wherein $\vec{a}$ is an element of a mask transmission function, said method comprising the steps of:

defining sampling points which are representative of said A, B, C and D;

defining indices for said sampling points to be k; defining a set of indices of said sampling points in a region i wherein i=A, B, C or D to be $N_i$;

determining whether said output intensity values of said sampling points are within said constraints;

defining local objective functions, $h_i(I(\vec{x}_k,\vec{a}))$, which includes a non-linear error function, $e_k$, represenative of said determination step, and includes a penalty factor, $\lambda_i$, reflective of the relative importance of each of said constraints, wherein said local objective functions provide that $$h_i(I(\vec{x}_k,\vec{a})) = \begin{cases} e_k(I(\vec{x}_k,\vec{a})) & \text{if } e_k(I(\vec{x}_k,\vec{a})) < 0 \\ \lambda_i e_k(I(\vec{x}_k,\vec{a})) & \text{if } e_k(I(\vec{x}_k,\vec{a})) > 0, \end{cases}$$

and wherein said error function $e_k(I(\vec{x}_k,\vec{a}))$ provided that $$e_k(I(\vec{x}_k,\vec{a})) = \begin{cases} I(\vec{x}_k,\vec{a}) - a & \text{if } \vec{x}_k \in A \\ b - I(\vec{x}_k,\vec{a}) & \text{if } \vec{x}_k \in B \\ I(\vec{x}_k,\vec{a}) - c & \text{if } \vec{x}_k \in C \\ d - I(\vec{x}_k,\vec{a}) & \text{if } \vec{x}_k \in D \end{cases}$$

combining said local objective functions to give a total objective function, $H(\vec{a})$, which is minimized for optimization, wherein said total objective provides that $$H(\vec{a}) = \sum_{k \in N_A} h_A(I(\vec{x}_k,\vec{a})) + \sum_{k \in N_B} h_B(I(\vec{x}_k,\vec{a})) + \sum_{k \in N_C} h_C(I(\vec{x}_k,\vec{a})) + \sum_{k \in N_D} h_D(I(\vec{x}_k,\vec{a})); \text{ and}$$

adjusting said mask pattern to provide for minimization by optimization of said total objective function;

transferring said mask pattern to a mask generating machine to generate a mask; and generating a mask.

3. A method for making masks for optical lithography or other projection printing, wherein said mask is represented by an initial mask pattern and wherein said mask provides a first output image on a resist developed wafer having a substantially binary configuration on a wafer, wherein on said wafer, A and B represent regions on a resist developed wafer, and wherein said output image is zero in domain A and one in domain B, and wherein as light is applied to said mask, said mask allows light to pass through it and onto a wafer at varying intensities, such intensities represented by output intensity values, I, at said and the threshold values of which produce said output images within constraints such that, $$I(\vec{x}) \leq a \quad \vec{x} \epsilon A$$
$$I(\vec{x}) \geq b \quad \vec{x} \epsilon B,$$

and wherein $\vec{x}$ represents spatial location on said wafer (x,y) and a and b are corresponding intensity threshold values at A and B respectively, and wherein the mask pattern is quantized into pixels represented by vector of pixel variables $\vec{a}$, said method comprising the steps of:
defining sampling points which are representative of said A and B;
defining indices for said sampling points to be k;
defining a set of indices of said sampling points in a region i wherein i=A or B to be $N_i$;
defining local objective functions, $h_i(I(\vec{x}_k,\vec{a}))$, which include error functions, $e_k$, representative of the degree to which said output intensity values of said sampling points are within said constraints, and which include a penalties, $\lambda_i$, reflective of the relative importance of each of said regions and contours, wherein said local objective functions provide that $$h_i(I(\vec{x}_k, \vec{a})) = \begin{cases} e_k(I(\vec{x}_k, \vec{a})) & \text{if } e_k(I(\vec{x}_k, \vec{a})) < 0 \\ \lambda_i e_k(I(\vec{x}_k, \vec{a})) & \text{if } e_k(I(\vec{x}_k, \vec{a})) > 0, \end{cases}$$

and wherein said error function $e_k(I(\vec{x}_k,\vec{a}))$ provides that $$e_k(I(\vec{x}_k, \vec{a})) = \begin{cases} I(\vec{x}_k, \vec{a}) - a & \text{if } \vec{x}_k \epsilon A \\ b - I(\vec{x}_k, \vec{a}) & \text{if } x_k \epsilon B \end{cases},$$

combining said local objective functions to give a total objective function, $H(\vec{a})$, wherein said total objective provides that $$H(\vec{a}) = \sum_{k \epsilon N_A} h_A(I(\vec{x}_k, \vec{a})) + \sum_{k \epsilon N_B} h_B(I(\vec{x}_k, \vec{a})); \text{ and}$$

adjusting said total objective function to provide for minimization by optimization of said total objective function; and
transferring said mask pattern to a mask generating machine to generate a mask; and
generating a mask.

4. A method as recited in claim 3 further including contour C which surrounds the boundaries of said region A and is said region A, and contour D which surrounds the boundaries of said region B and is in said region B, and wherein said constraints further include, $$I(\vec{x}) \leq c \quad \vec{x} \epsilon C$$
$$I(\vec{x}) \geq d \quad \vec{x} \epsilon D,$$

wherein c and d are corresponding intensity threshold values at C and D respectively, said method further comprises the steps of:
defining sampling points which are representative of C and D;
defining i to include C or D;
defining said error function to include, $$e_k(I(\vec{x}_k, \vec{a})) = \begin{cases} I(\vec{x}_k, \vec{a}) - c & \text{if } \vec{x}_k \epsilon C \\ d - I(\vec{x}_k, \vec{a}) & \text{if } \vec{x}_k \epsilon D \end{cases};$$

combining said local objective functions to give a total objective function, $$H(\vec{a}) = \sum_{k \epsilon N_A} h_A(I(\vec{x}_k, \vec{a})) + \sum_{k \epsilon N_B} h_B(I(\vec{x}_k, \vec{a})) + \sum_{k \epsilon N_C} h_C(I(\vec{x}_k, \vec{a})) + \sum_{k \epsilon N_D} h_D(I(\vec{x}_k, \vec{a})).$$

5. A method as recited in claim 1 or 2 or 3 wherein said output image is optimized on a plurality of optical planes.

6. A method as recited in claim 1 or 2 or 3 where at three of said plurality of optical planes, said output intensity is optimized, thereby producing a focusing plane shift at the center optical plane.

7. A method as recited in claim 1 or 2 or 3 wherein said adjusting step is performed by simulated annealing.

8. A method as recited in claim 1 or 2 or 3 wherein said adjusting step is performed by branch and bound optimization.

9. A method as recited in claim 1 or 2 or 3 wherein said adjusting step is performed by iterative optimization.

10. A method as recited in claim 1 or 2 or 3 wherein said sampling points are rectangular.

11. A method as recited in claim 1 or 2 or 3 wherein said local objective function is non-linear.

* * * * *